(12) United States Patent  
Quayle et al.

(10) Patent No.: US 7,738,398 B2
(45) Date of Patent: *Jun. 15, 2010

(54) SYSTEM AND METHOD FOR CONFIGURING COMMUNICATION SYSTEMS

(75) Inventors: Barton L. Quayle, San Jose, CA (US); Mitchell G. Poplack, Mountain View, CA (US); Peter Tannenbaum, Highland, NY (US)

(73) Assignee: Quickturn Design Systems, Inc., San Jose, CA (US)

( * ) Notice: Subject to any disclaimer, the term of this patent is extended or adjusted under 35 U.S.C. 154(b) by 1520 days.

This patent is subject to a terminal disclaimer.

(21) Appl. No.: 10/992,165

(22) Filed: Nov. 17, 2004

(65) Prior Publication Data

US 2005/0271078 A1 Dec. 8, 2005

Related U.S. Application Data

(60) Provisional application No. 60/576,611, filed on Jun. 1, 2004, provisional application No. 60/576,691, filed on Jun. 1, 2004.

(51) Int. Cl.
*H04L 12/28* (2006.01)
(52) U.S. Cl. ..................................... 370/254
(58) Field of Classification Search ......... 370/241–253, 370/453, 254, 257–258, 395.2, 395.21, 395.3; 703/13–15, 20, 23–26, 28; 714/28, 30, 33; 702/108–128
See application file for complete search history.

(56) References Cited

U.S. PATENT DOCUMENTS

| 4,306,286 A | 12/1981 | Cocke et al. ............... 364/200 |
| 4,488,354 A | 12/1984 | Chan et al. ................. 29/830 |
| 4,635,218 A | 1/1987 | Widdoes .................... 364/578 |
| 4,639,058 A * | 1/1987 | Morgan ..................... 439/68 |
| 4,656,580 A | 4/1987 | Hitchcock, Sr. et al. ..... 364/200 |
| 4,660,141 A * | 4/1987 | Ceccon et al. ............... 710/9 |
| 4,674,089 A | 6/1987 | Poret et al. ................. 371/25 |
| 4,697,241 A | 9/1987 | Lavi ......................... 364/488 |

(Continued)

OTHER PUBLICATIONS

Wynn, "In-Circuit Emulation for ASIC-Based Designs" VLSI Systems Design, Oct. 1986, pp. 38-45.

(Continued)

*Primary Examiner*—Kwang B Yao
*Assistant Examiner*—Kenan Cehic
(74) *Attorney, Agent, or Firm*—Orrick, Herrington & Sutcliffe LLP

(57) ABSTRACT

An identification system for identifying and validating selected components of a communication system and methods for manufacturing and using same. The communication system includes a host system that is configured to couple with one or more target systems. When the host system is coupled with a selected target system, the communication system can enter an identification mode wherein the selected target system can provide identification data to the host system. The identification data includes information regarding at least one target system characteristic associated with the selected target system such that the host system can attempt to identify the selected target system based at least in part upon the target system characteristics. Once the selected target system has been identified, the communication system likewise can at least partially reconfigure the host system, as necessary, such that the host system can be compatible with the selected target system.

22 Claims, 25 Drawing Sheets

U.S. PATENT DOCUMENTS

| | | | |
|---|---|---|---|
| 4,901,259 A | 2/1990 | Watkins | 364/578 |
| 4,914,612 A | 4/1990 | Beece et al. | 364/578 |
| 4,972,470 A * | 11/1990 | Farago | 713/192 |
| 5,036,473 A | 7/1991 | Butts et al. | |
| 5,109,353 A | 4/1992 | Sample et al. | 364/580 |
| 5,126,966 A | 6/1992 | Hafeman et al. | 364/500 |
| 5,224,055 A | 6/1993 | Grundy et al. | 364/488 |
| 5,339,262 A | 8/1994 | Rostoker et al. | 364/578 |
| 5,353,243 A | 10/1994 | Read et al. | 364/578 |
| 5,448,496 A | 9/1995 | Butts et al. | 364/489 |
| 5,452,239 A | 9/1995 | Dai et al. | 364/578 |
| 5,475,624 A | 12/1995 | West | 364/578 |
| 5,475,830 A | 12/1995 | Chen | 395/500 |
| 5,546,562 A | 8/1996 | Patel | 395/500 |
| 5,551,013 A | 8/1996 | Beausoleil | 395/500 |
| 5,574,388 A | 11/1996 | Barbier et al. | 326/41 |
| 5,596,742 A | 1/1997 | Agrawal et al. | 395/500 |
| 5,649,176 A | 7/1997 | Selvidge et al. | 395/551 |
| 5,659,716 A | 8/1997 | Selvidge et al. | 395/500 |
| 5,663,900 A | 9/1997 | Bhandari et al. | 364/578 |
| 5,680,583 A | 10/1997 | Kuijsten | 395/500 |
| 5,754,827 A | 5/1998 | Barbier et al. | 395/500 |
| 5,761,484 A | 6/1998 | Agarwal et al. | 395/500 |
| 5,777,489 A | 7/1998 | Barbier et al. | 326/40 |
| 5,790,832 A | 8/1998 | Barbier et al. | 395/500 |
| 5,822,564 A | 10/1998 | Chilton et al. | 395/500 |
| 5,920,712 A | 7/1999 | Kuijsten | 395/500 |
| 5,923,865 A | 7/1999 | Chilton et al. | 395/500 |
| 6,609,034 B1 * | 8/2003 | Behrens et al. | 700/19 |
| 6,747,508 B2 * | 6/2004 | Liu et al. | 327/543 |
| 6,842,865 B2 * | 1/2005 | Nee et al. | 714/28 |
| 6,945,712 B1 * | 9/2005 | Conn | 385/94 |
| 2003/0173990 A1 * | 9/2003 | Nanbu | 324/765 |
| 2004/0046579 A1 * | 3/2004 | Chraft et al. | 324/754 |
| 2004/0068699 A1 * | 4/2004 | Morris et al. | 716/4 |
| 2005/0099862 A1 * | 5/2005 | Lunde | 365/201 |
| 2005/0172187 A1 * | 8/2005 | Angelotti et al. | 714/724 |
| 2006/0117274 A1 * | 6/2006 | Tseng et al. | 716/1 |
| 2007/0035324 A1 * | 2/2007 | Antley et al. | 324/765 |
| 2008/0028349 A1 * | 1/2008 | Muranaka | 716/5 |
| 2008/0306722 A1 * | 12/2008 | Fujii et al. | 703/15 |

OTHER PUBLICATIONS

Beresford, "Hard Facts, Soft ASICS," VLSI Systems Design, Dec. 1986, p. 8.

Beresford, "An Emulator for CMOS ASICS," VLSI Systems Design, May 4, 1987, p. 8.

Schmitz, "Emulation of VLSI Devices Using LCAs," VLSI systems Design, May 20, 1987, pp. 54-62.

Tham, "Parallel Processing CAD Applications", IEEE Design & Test of Computer, Oct. 1987, pp. 13-17.

Agrawal, et al. "MARS: A Multiprocessor-Based Programmable Accelerator", IEEE Design & Test Computers, Oct. 1987, pp. 28-36.

Agarwal, "Virtual Wires: A Technology for Massive Multi-FPGA Systems," Virtual Machine Works, Inc., undated, pp. 1-24.

* cited by examiner

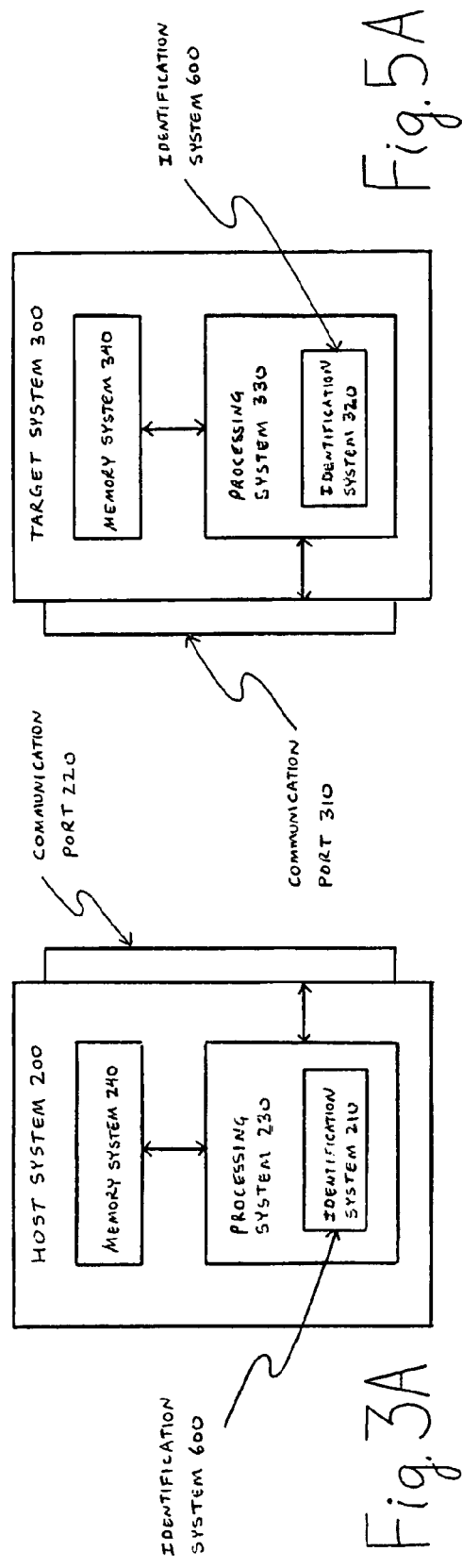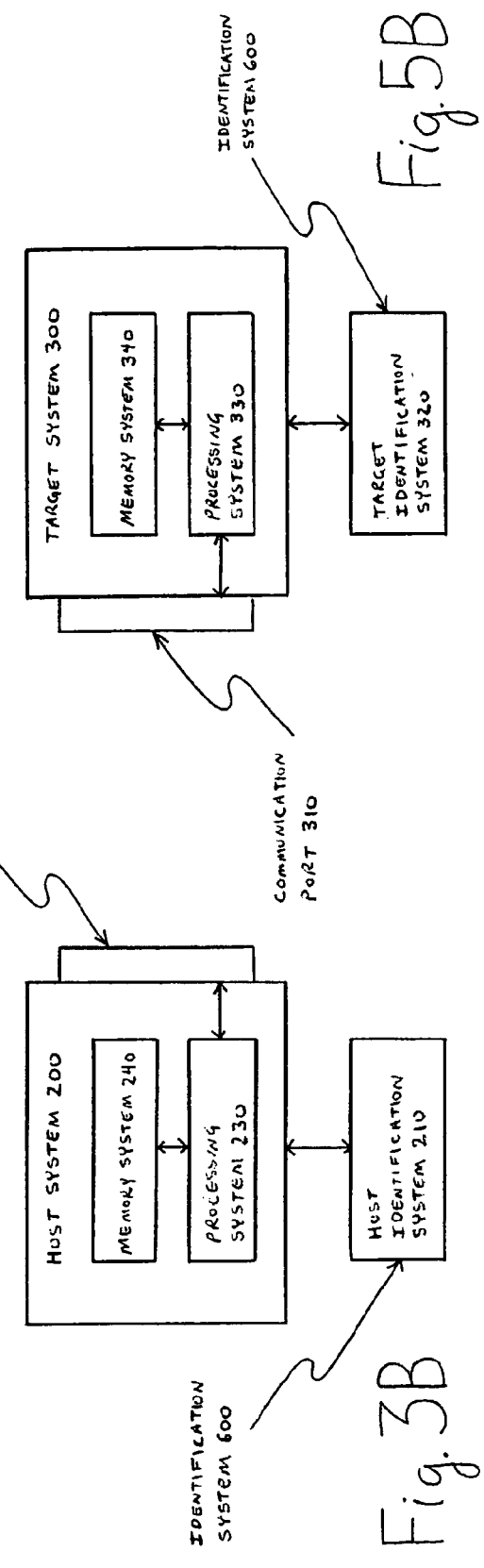

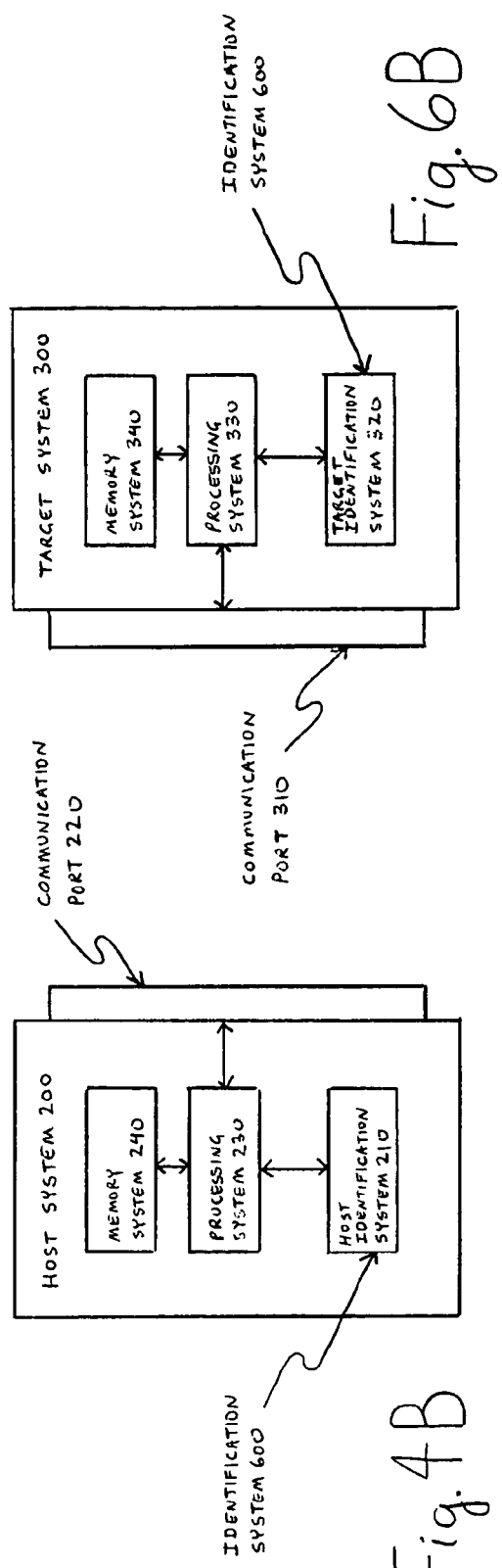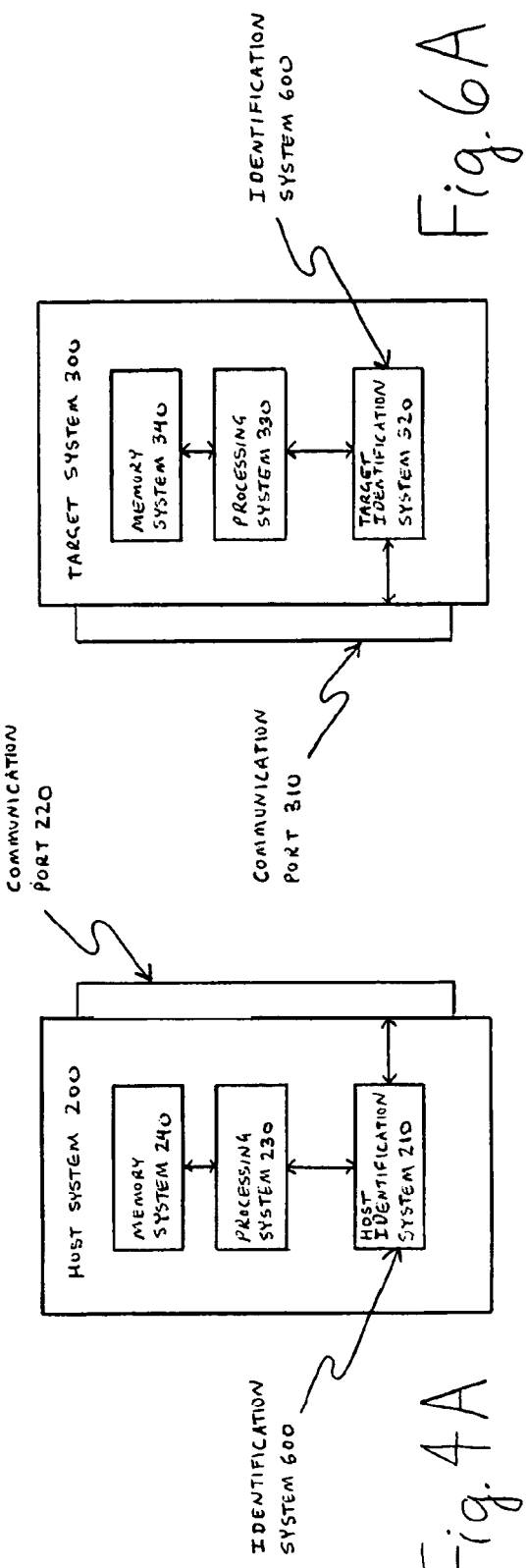

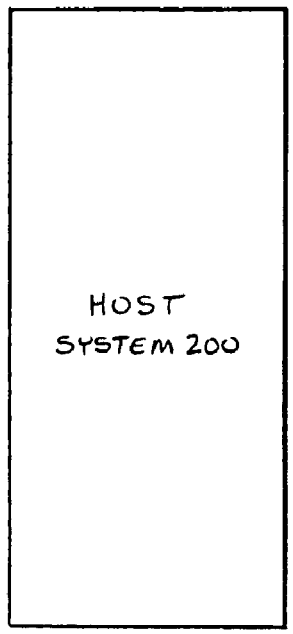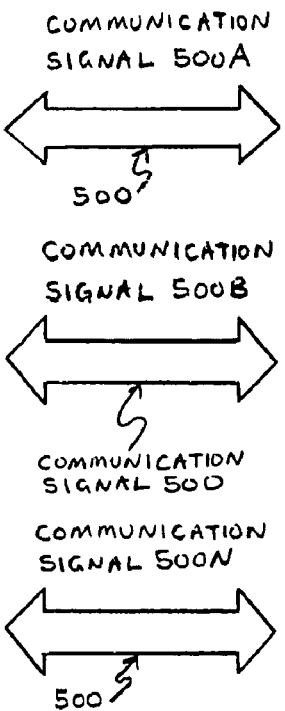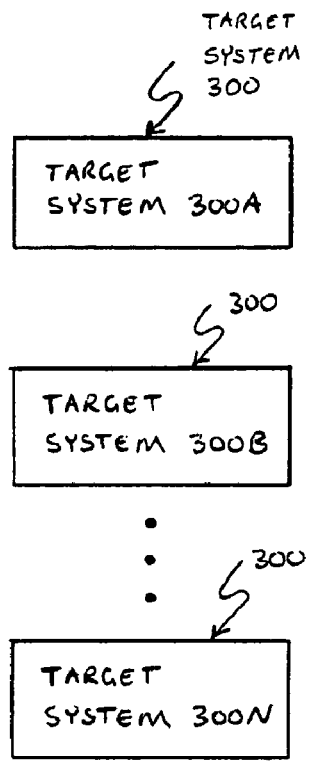
Fig. 14A
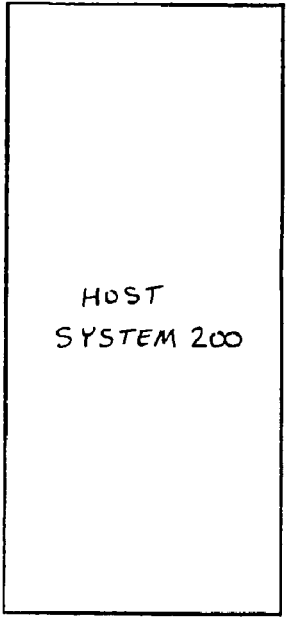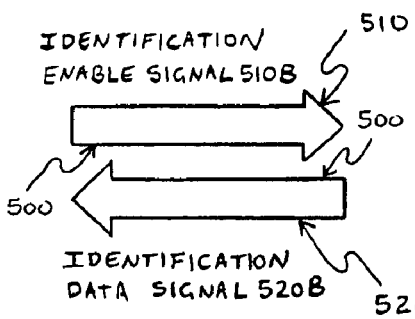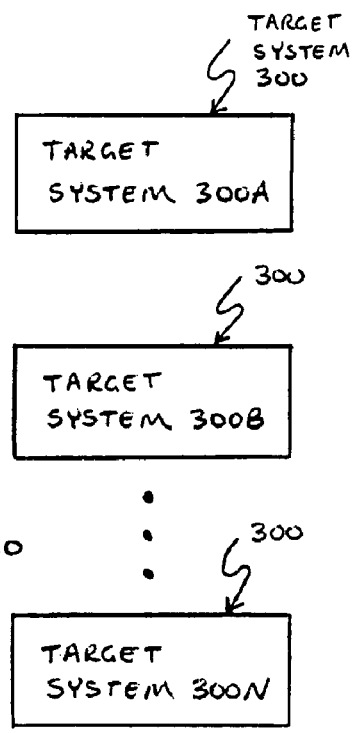
Fig. 14B

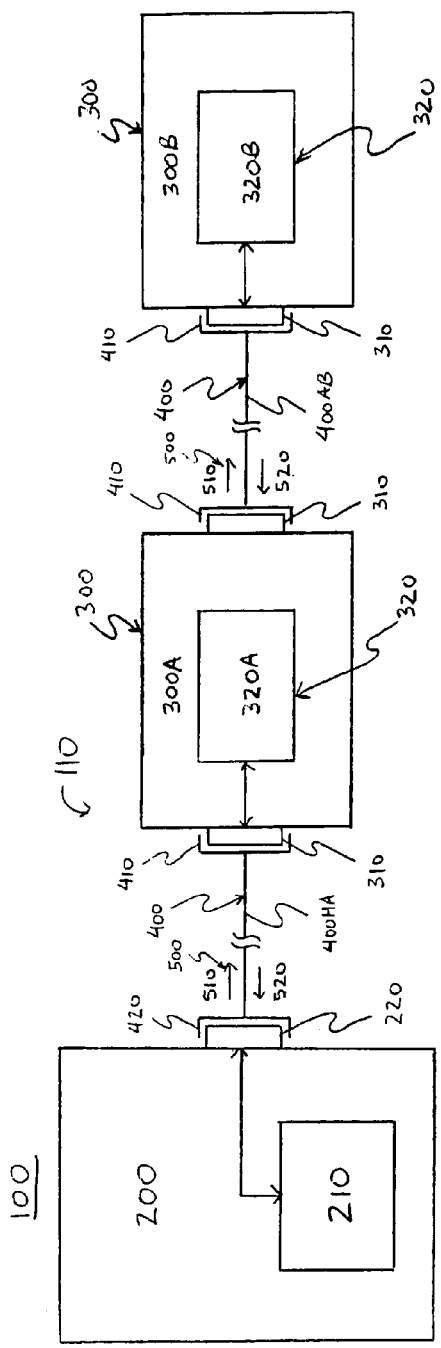
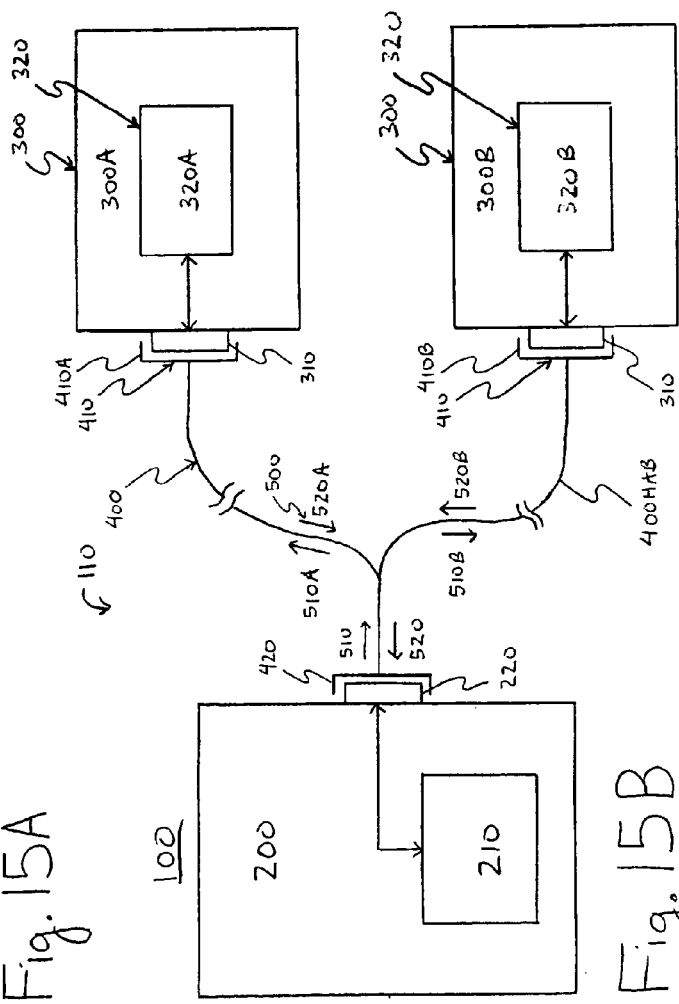

SYSTEM AND METHOD FOR CONFIGURING COMMUNICATION SYSTEMS

CROSS-REFERENCE TO RELATED APPLICATIONS

This application claims priority to U.S. Provisional Application Ser. No. 60/576,611 and U.S. Provisional Application Ser. No. 60/576,691, each being filed on Jun. 1, 2004. Priority to these prior applications is expressly claimed, and the disclosures of both applications are hereby incorporated by reference in their entireties.

FIELD OF THE INVENTION

The present invention relates generally to communication systems and more particularly, but not exclusively, to design verification systems for developing logic circuits.

BACKGROUND OF THE INVENTION

Reconfigurable logic circuits, such as field-programmable gate arrays (FPGAs), and non-reconfigurable logic circuits, such as application-specific integrated circuits (ASICs), have many applications, including use in prototypes as well as end-products, and advantageously provide immediate, full-speed operation in prototype or pre-production form. The ability to debug such logic circuits in a real environment is very desirable.

Design verification systems, such as accelerators, simulators, and/or emulators, traditionally are used to provide emulation environments for developing logic circuits, including reconfigurable logic circuits and non-reconfigurable logic circuits. Such design verification systems include connector systems that, by their nature, are used with many different system configurations. For example, each system configuration can require different types of cable assemblies and/or subsystems to be coupled with the connector systems of the design verification systems. Each cable assembly and subsystem must be identified and/or verified to inhibit incorrect system configurations that can damage the design verification system, the cables, and the devices.

The connector systems of some commercially-available design verification systems are keyed to inhibit improper connection between the design verification systems and the cable assemblies and/or subsystems. Thereby, only one selected type of functional cable assembly typically is permitted to couple with each connector system. Other design verification systems include connector systems with dedicated identification pins for enabling selected specific functions. Since system users frequently are responsible for specifying the permitted usages of such connector systems, however, these design verification systems typically do not include any provisions for guaranteeing that the identification pins have been properly configured.

In view of the foregoing, a need exists for an improved design verification system that overcomes the aforementioned obstacles and deficiencies of currently-available design verification systems.

SUMMARY OF THE PREFERRED EMBODIMENTS

The present invention is directed toward a communication system that is configured to identify and validate one or more hardware components and/or software components of different types of target systems, such as cable assemblies and/or subsystems, that have been coupled with a host system and that can reconfigure the host system, as necessary, such that the host system can be compatible with the identified target systems.

Comprising a host system that can communicate with a target system, the communication system can have an identification mode and an operation mode. In the identification mode, the communication system can be configured to identify the target system, such as by exchanging at least one communication signal between the host system and the target system. For example, the host system can provide an identification request signal to the target system, which is configured to respond by providing an identification data signal. The identification data signal includes information regarding one or more target system characteristics associated with the target system.

The host system is configured to receive the identification data signal. Upon receiving the identification data signal, the host system can attempt to identify the target system based, in whole and/or in part, upon the target system characteristic information. The communication system likewise can at least partially reconfigure the host system, as necessary, such that the host system can be configured to be compatible with the identified target system. Thereby, upon entering the operation mode, the host system and the target system preferably are compatible and are configured to communicate in a conventional manner.

Other aspects and features of the present invention will become apparent from consideration of the following description taken in conjunction with the accompanying drawings.

BRIEF DESCRIPTION OF THE DRAWINGS

FIG. 3A is a block diagram illustrating an alternative embodiment of the host system of FIG. 2 in which the identification system is at least partially incorporated with the host system.

FIG. 3B is a block diagram illustrating an alternative embodiment of the host system of FIG. 3A in which the identification system is separate from the host system.

FIG. 4A is a block diagram illustrating another alternative embodiment of the host system of FIG. 2 in which the host system communicates with the target system via the identification system.

FIG. 4B is a block diagram illustrating an alternative embodiment of the host system of FIG. 4A in which the identification system communicates with the target system via the host system.

FIG. 5A is a block diagram illustrating another alternative embodiment of the target system of FIG. 2 in which the identification system communicates with the host system via the target system.

FIG. 5B is a block diagram illustrating an alternative embodiment of the target system of FIG. 5A in which the target system communicates with the host system via the identification system.

FIG. 6A is a block diagram illustrating another alternative embodiment of the target system of FIG. 2 in which the identification system is at least partially incorporated with the target system.

FIG. 6B is a block diagram illustrating an alternative embodiment of the target system of FIG. 6A in which the identification system is separate from the target system.

FIG. 14A is an exemplary top-level block diagram illustrating an alternative embodiment of the communication system of FIGS. 2A-B in which the communication system includes a host system and a plurality target system.

FIG. 14B is an exemplary top-level block diagram illustrating the communication system of FIG. 14A in an identification mode.

FIG. 15A is a detail drawing illustrating an embodiment of the communication system of FIGS. 14A-F in which the host system includes a communication port for coupling with the plurality of target systems via a communication cable assembly.

FIG. 15B is a detail drawing illustrating an alternative embodiment of the communication system of FIGS. 14A-F in which the communication port of the host system can couple with the plurality of target systems provided in a parallel arrangement.

Figure 1B:
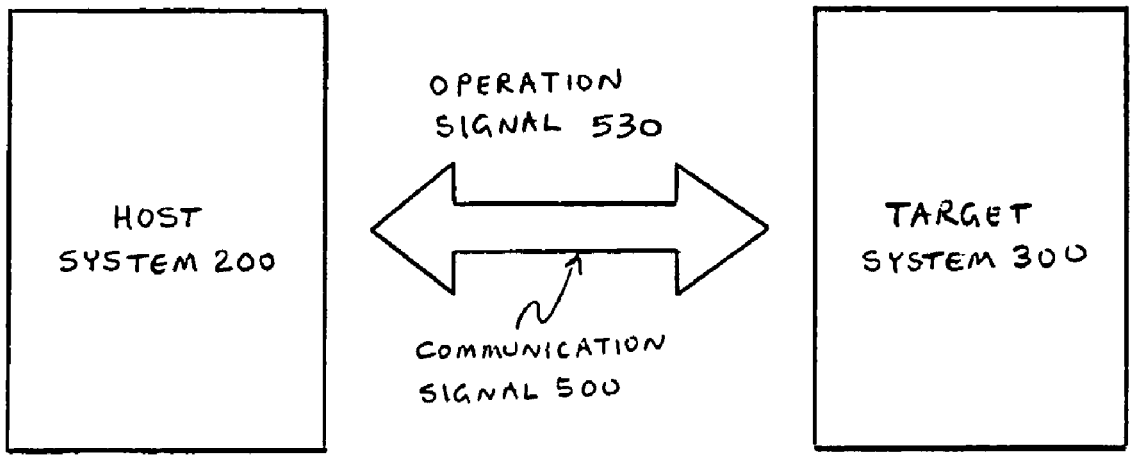
FIG. 1B is an exemplary top-level block diagram illustrating the communication system of FIG. 1A in an operation mode.

It should be noted that the figures are not drawn to scale and that elements of similar structures or functions are generally represented by like reference numerals for illustrative purposes throughout the figures. It also should be noted that the figures are only intended to facilitate the description of the preferred embodiments of the present invention. The figures do not describe every aspect of the present invention and do not limit the scope of the invention.

DETAILED DESCRIPTION OF THE PREFERRED EMBODIMENTS

Since the use of incompatible cables and/or systems can result in system damage, a communication system that can automatically identify, and, as necessary, reconfigure itself to communicate with, associated cables and/or systems can prove much more desirable and provide a basis for a wide range of system applications, such as design verification systems. This result can be achieved, according to one embodiment disclosed herein, by employing a communication system 100 as shown in FIGS. 1A-B.

Figure 1A:
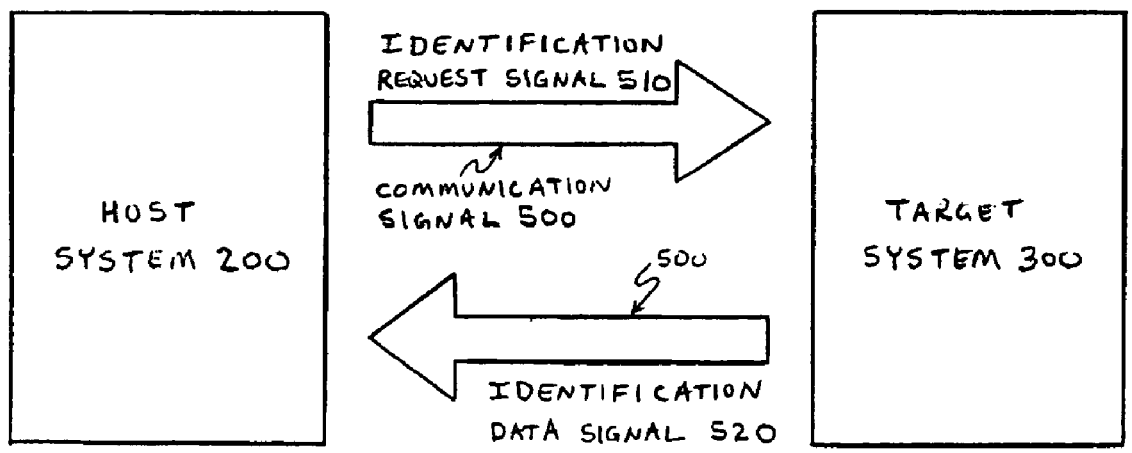
FIG. 1A is an exemplary top-level block diagram illustrating an embodiment of a communication system in which the communication system includes a host system and a target system.

Being illustrated as comprising a host system 200 that can couple with, and communicate with, a target system 300, the exemplary communication system 100 can have a target system identification mode 110 as shown in FIG. 1A and a target system operation mode 120 as illustrated in FIG. 1B. As desired, the communication system 100 can initiate the identification mode 110 of FIG. 1A, preferably via the host system 200. In the identification mode 110, the communication system 100 can be configured to identify the target system 300. The communication system 100 can attempt to identify the target system 300 in any suitable manner such as by exchanging at least one communication signal 500, such as one or more identification signals 510, 520, between the host system 200 and the target system 300. As shown in FIG. 1A, for example, the host system 200 can provide an identification request signal 510 to the target system 300. Upon receiving the identification request signal 510, the target system 300 preferably is configured to respond by providing an identification data signal 520. The host system 200 can receive the identification data signal 520 and, thereby, can attempt to identify the target system 300. The identification data signal 520 preferably includes information regarding one or more target system characteristics associated with the target system 300 such that the host system 200 can attempt to identify the target system 300 based, in whole and/or in part, upon the target system characteristics.

The communication system 100 likewise can at least partially reconfigure the host system 200, as necessary, in anticipation of entering the operation mode 120 as shown in FIG. 1B. Thereby, the host system 200 can be compatible with the target system 300. Stated somewhat differently, the host system 200 preferably is reconfigurable such that it is compatible with the target system 300. Upon entering the operation mode 120, the host system 200 and the target system 300 therefore are compatible and are configured to communicate. As shown in FIG. 1B, for example, the host system 200 can be configured to exchange at least one communication signal 500, such as an operation signal 530, with the target system 300 when the communication system 100 is in the operation mode 120. In the manner set forth above with reference to the host system 200, the communication system 100 likewise can be configured such that the target system 300 can identify the host system 200 and/or such that the target system 300 can be at least partially reconfigured, as necessary, to be compatible with the host system 200.

Figure 2:
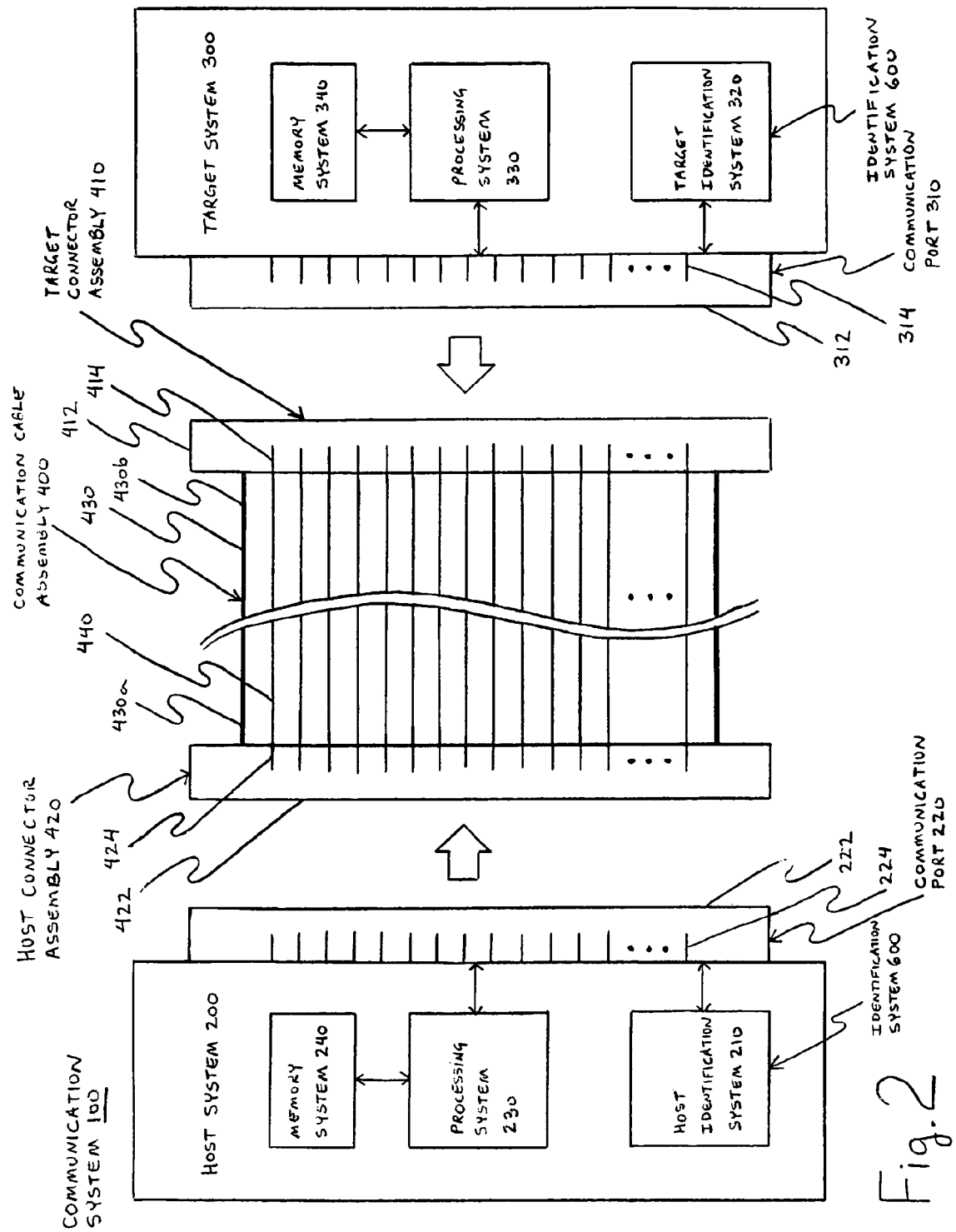
FIG. 2 is a detail drawing illustrating an embodiment of the communication system of FIGS. 1A-B in which the communication system includes an identification system for identifying the target system.

An exemplary communication system 100 comprises a conventional communication system 100 and is illustrated in FIG. 2 as comprising a host system 200, a target system 300, and a communication cable assembly 400. The host system 200 can be provided in any suitable manner and includes at least one communication port 220 for coupling the host system 200 with the target system 300. Being configured to exchange the communication signal 500 (shown in FIGS. 1A-B) between the host system 200 and the relevant target system 300, each communication port 220 includes a connector assembly 222 having a plurality of contacts, pins, or terminals 224, such as user-definable terminals and/or reserved terminals. Each communication port 220 can have any appropriate number of terminals 224, which number can be related to the number of communication signals 500 exchanged between the host system 200 and the relevant target system 300, as desired. The communication ports 220 likewise can comprise one or more types of connector assemblies such that the number of terminals 224 can be uniform, and/or differ, among the communication ports 220. The communication signal 500 can comprise a communication signal of any conventional type, including the identification request signal 510 (shown in FIG. 1A), the identification data signal 520 (shown in FIG. 1A), and/or the operation signal 530 (shown in FIG. 1B), that can be communicated between the host system 200 and the target system 300. As desired, the communication signal 500 likewise can comprise one or more power signals (not shown) and/or ground signals (not shown).

As shown in FIG. 2, the host system 200 generally can be provided as a conventional single-user computer system, such as a personal computer system and/or workstation, without limitation and can include a processing system 230 and/or a memory system 240. The processing system 230 can comprise any appropriate type of processing system, such as special-purpose processing systems and/or general purpose processing systems of any kind. Exemplary processing systems 230 include one or more microprocessors (μPs), central processing units (CPUs), digital signal processors (DSPs), application-specific integrated circuits (ASICs), field-programmable gate arrays (FPGAs), and/or programmable logic arrays (PLAs). The exemplary processing systems 230 are provided herein for purposes of illustration and not for purposes of limitation. The processing system 230 is configured to receive incoming communication signals 500 provided, for example, by the target system 300 and to perform one or more functions, as desired, on the incoming communication signals 500. The processing system 230 can provide the result of the functions to the memory system 240 and/or the target system 300, as desired.

Being coupled with, and configured to communicate with, the processing system 230, the memory system 240 is configured to provide data storage. The memory system 240 can store and provide any conventional type of information, including instruction code, such as software or firmware, intermediate calculation results, and other information associated with the processing system 230. In the manner set forth above, information associated with the communication signals 500 likewise can be stored and provided by the memory system 240. Preferably including a non-volatile memory system, the memory system 240 can comprise any suitable type of memory system, such as any electronic, magnetic, and/or optical storage media, without limitation. For example, exemplary storage media can include one or more static random access memories (SRAMs), dynamic random access memories (DRAMs), electrically-erasable programmable read-only memories (EEPROMs), FLASH memories, hard drives (HDDs), compact disks (CDs), and/or digital video disks (DVDs) of any kind. Although shown and described as being separate from the processing system 230 for purposes of illustration, the memory system 240 can be at least partially integrated with the processing system 230 as desired.

The host system 200 preferably comprises a conventional design verification system, such as an accelerator, a simulator, and/or an emulator, for developing the target system 300 and/or one or more components of the target system 300. Exemplary design verification systems include the Palladium acceleration/emulation system and the NC-Sim simulation system each produced by Cadence Design Systems, Inc., of San Jose, Calif. As desired, other peripheral systems (not shown), such as one or more additional hardware or software development platforms, computers, and/or test equipment, also may be coupled with the host system 200 and/or the target system 300. By providing an emulation environment for the target system 300, the host system 200 can for perform functional verification for all of, or at least one component of, the target system 300 in any appropriate manner. For example, the host system 200 can provide co-simulation and/or simulation acceleration and/or can be configured for in-circuit use. The host system 200 likewise can provide a platform for performing hardware and software co-verification for the target system 300.

As set forth above with regard to the host system 200, the target system 300 can be provided in any suitable manner and, for purposes of illustration only, is shown and described with reference to FIG. 2 as being provided in the same general manner as the host system 200. The target system 300 can include one or more communication ports 310 for coupling the host system 200 with the target system 300. Each communication port 310 can be configured to exchange communication signals 500 between the host system 200 and the relevant target system 300 and is illustrated as having a connector assembly 312 having a plurality of contacts, pins, or terminals 314, such as user-definable terminals and/or reserved terminals. The number of terminals 314 associated with each communication port 310 can comprise any suitable number of terminals 314. In the manner discussed above, the number of terminals 314 can be uniform, and/or differ, among the communication ports 310 and, as desired, can be related to the number of communication signals 500 exchanged between the host system 200 and the relevant target system 300. Stated somewhat differently, the communication ports 310 can comprise one or more types of connector assemblies.

The target system 300 can include a processing system 330 and/or a memory system 340 as illustrated in FIG. 2. The processing system 330 of the target system 300 can be provided in the manner discussed above with reference to the processing system 230 of the host system; whereas, the memory system 340 can be provided in the manner set forth above regarding the memory system 240. Here, the processing system 330 can be configured to receive communication signals 500 provided, for example, by the host system 300 and to perform one or more functions, as desired, on the communication signals 500. The processing system 330 likewise can provide the result of the functions to the memory system 340 and/or the host system 200. The processing system 330 is coupled with, and configured to communicate with, the memory system 340, which provides data storage for the target system 300. As discussed above with regard to the memory system 240, the memory system 340 can store and provide any conventional type of information, including information, such as instruction code and/or intermediate calculation results, associated with the processing system 330 and/or information associated with the communication signals 500.

Although shown and described as being provided in the same manner with reference to FIG. 2 for purposes of illustration, the host system 200 and the target system 300 can be provided in any suitable uniform and/or different manner, as desired. If the host system 200 comprises a conventional design verification system as discussed above, the target system 300 can be provided to develop and/or verify one or more software components and/or one or more hardware components that are under development. Stated somewhat differently, the communication system 100 can be provided as a hardware emulator to allow users to verify that the circuit they have designed will function in the system in which the integrated circuit will eventually reside (i.e., the target system 300) in the manner disclosed in U.S. Pat. Ser. No. 5,886,904, the disclosure of which is hereby incorporated herein by reference in its entirety. The target system 300 likewise can include other peripheral systems and subsystems of the design verification system, as desired. Because such emulated representations allow a circuit designer flexibly to operate or develop the target system 300 coupled to the emulated representation, even before the prototype circuit design or hardware is actually manufactured, overall design time and cost is reduced significantly as set forth in U.S. Pat. No. 5,940,603, the disclosure of which is hereby incorporated herein by reference in its entirety.

For example, the processing system 330 can comprise a logic circuit and can be assembled, along with one or more electronic components, such as integrated components and/or discrete components, on a hardware development platform (not shown) in the manner known in the art. Exemplary logic circuits can include reconfigurable logic circuits, such as one or more field-programmable gate arrays (FPGAs), and/or non-reconfigurable logic circuits, such as one or more application-specific integrated circuits (ASICs). Once assembled, the reconfigurable logic circuit can be customized to implement a user design by loading configuration data into the reconfigurable logic circuit. By programming the internal memory cells, a customized configuration is established within the reconfigurable logic circuit. Thereby, the user design can be implemented by the reconfigurable logic circuit and evaluated by operating the reconfigurable logic circuit on the hardware development platform and in conjunction with the design verification system and any other peripheral systems.

The host system 200 and the target system 300 can be coupled, and configured to communicate, via the communication cable assembly 400 such that the communication signals 500 can be exchanged between the host system 200 and the target system 300. Although any suitable type of communication cable assembly 400 can be used to couple the host system 200 and the target system 300, the communication cable assembly 400 preferably comprises a conventional communication cable assembly that is standardized. Thereby, the communication cable assembly 400 can be configured to couple diverse combinations of host systems 200 and the target systems 300. The communication system 100 likewise can be associated with any appropriate number of communication cable assemblies 400 such that a wide variety of host systems 200 and the target systems 300 can be accommodated.

An exemplary communication cable assembly 400 is illustrated in FIG. 2. The communication cable assembly 400 is shown as including a target connector assembly 410 and a host connector assembly 420 that are coupled via a communication cable 430. Although shown and described as being provided adjacent to the opposite end regions 430a, 430b of the communication cable 430 for purposes of illustration, the target connector assembly 410 and the host connector assembly 420 can be associated with any suitable portion, such as an intermediate region, of the communication cable 430. The target connector assembly 410 and host connector assembly 420 each can be provided in any suitable manner. Being configured to couple with, and/or mate with, the communication port 310 of the target system 300, the target connector assembly 410 is illustrated as comprising a connector assembly 412 having any appropriate number of contacts, pins, or terminals 414. Similarly, the host connector assembly 420 can couple with, and/or mate with, the communication port 220 of the host system 200 and is shown as including a connector assembly 422 with a suitable number of contacts, pins, or terminals 424.

The communication cable 430 includes a plurality of conductors 440, which connect one or more of selected terminals 414 of the target connector assembly 410 with at least one predetermined terminal 424 of the host connector assembly 420. Stated somewhat differently, the selected terminal 414 can be coupled with one or more other terminals 414 of the target connector assembly 410 and/or one or more terminals 424 of the host connector assembly 420 in a predetermined manner. The conductors 440 likewise can connect one or more of selected terminal 424 of the host connector assembly 420 with at least one predetermined terminal 414 of the target connector assembly 410. As desired, one or more terminals 414 of the target connector assembly 410 and/or one or more terminals 424 of the host connector assembly 420 can remain unconnected. Thereby, when the communication system 100 is properly assembled, the communication signals 500 can be exchanged between the communication ports 220 of the host system 200 and the communication ports 310 of the target system 300 via the communication cable assembly 400.

The communication system 100 likewise can include an identification system 600 for identifying the target system 300. When the communication system 100 is in the identification mode 110 (shown in FIG. 1A), the identification system 600 can be configured to identify the target system 300, preferably by identifying one or more hardware components and/or one or more software components of the target system 300. The identification system 600 can become transparent to system operation when the communication system 100 is in the operation mode 120 (shown in FIG. 1B). In other words, once the target system 300 has been identified, the identification system 600 preferably has a negligible effect on the operation and/or performance of the communication system 100. The communication system 100 thereby is configured to operate as a conventional communication system in the operation mode 120, exchanging communication signals 500, such as an operation signal 530 (shown in FIG. 1B), between the host system 200 and the target system 300.

As desired, the identification system 600 can be associated with the host system 200 and/or the target system 300. For purposes of illustration, the identification system 600 is shown in FIG. 2 as comprising a host identification system 210 and a target identification system 320. Comprising the portion of the identification system 600 that is associated with the host system 200, the host identification system 210 can provide the identification request signal 510 (shown in FIG. 1A) and can receive the identification data signal 520 (shown in FIG. 1A). The host identification system 210 can be provided in any suitable manner and be at least partially incorporated with the host system 200, such with the processing system 230 as illustrated in FIG. 3A, and/or can be separate from the host system 200 as shown in FIG. 3B.

The host identification system 210 likewise can be coupled with, and configured to communicate with, the communication port 220 of the host system 200. Thereby, the host identification system 210 can communicate with the target system 300 and/or the target identification system 320 via the communication port 200. In other words, the host identification system 210 can provide the identification request signal 510 (shown in FIG. 7A) to the target identification system 220 and/or can receive the identification data signal 520 (shown in FIG. 7A) from the target identification system 220 via the communication port 310. As desired, the host identification system 210 can be coupled with the communication port 220 in any appropriate manner, such as directly and/or indirectly via any arrangement of one or more intermediate components. The host identification system 210, for example, is shown in FIG. 2 as being directly coupled with the coupled with the communication port 220.

FIG. 4A illustrates the host identification system 210 as being disposed between the communication port 220 and the processing system 230 and/or the memory system 240 of the host system 200. The processing system 230 and/or the memory system 240 thereby can directly communicate with the communication port 220, and therefore the target system 300 and/or the target identification system 320, via the host identification system 210. Similarly, the host identification system 210 can be configured to indirectly communicate with the communication port 220, and therefore the target system 300 and/or the target identification system 320, via the processing system 230 and/or the memory system 240 as illustrated in FIG. 4B. Stated somewhat similarly, the processing system 230 and/or the memory system 240 can be disposed between the host identification system 210 and the communication port 220.

Returning to FIG. 2, the target identification system 320 comprises the portion of the identification system 600 that is associated with the target system 300. The target identification system 320 can be provided in any suitable manner and is configured to cooperate with the host identification system 210. When the communication system 100 is in the identification mode 110, for example, the target identification system 320 can receive the identification request signal 510 from the host identification system 210 and can provide the identification data signal 520 to the host identification system 210. In the manner set forth above with regard to the host identification system 210 (shown in FIGS. 3A-B), the target identification system 320 can be at least partially incorporated with the target system 300, such with the processing system 330 as illustrated in FIG. 5A, and/or can be separate from the target system 300 as shown in FIG. 5B.

The target identification system 320 likewise can be coupled with, and configured to communicate with, the communication port 310 of the target system 300. In the manner discussed above with reference to the host identification system 210 of FIGS. 4A-B, the target identification system 320 can be directly and/or indirectly coupled with the communication port 310 such that the target identification system 320 can communicate with the host system 200 and/or the host identification system 210. For example, the target identification system 320 is shown in FIG. 2 as being directly coupled with the communication port 310. The target identification system 320 thereby can receive the identification request signal 510 from the host identification system 210 and can provide the identification data signal 520 to the host identification system 210 via the communication port 310.

As desired, the target identification system 320 can be disposed between the communication port 310 and the processing system 330 and/or the memory system 340 of the target system 300 as illustrated in FIG. 6A. The processing system 330 and/or the memory system 340 thereby can communicate with the communication port 310, and therefore the host system 200 and/or the host identification system 210, via the target identification system 320. Similarly, FIG. 6B shows the target identification system 320 as being configured to indirectly communicate with the communication port 310, and therefore the host system 200 and/or the host identification system 210, via the processing system 330 and/or the memory system 340. Stated somewhat similarly, the processing system 330 and/or the memory system 340 can be disposed between the target identification system 320 and the communication port 310.

Figure 7A:
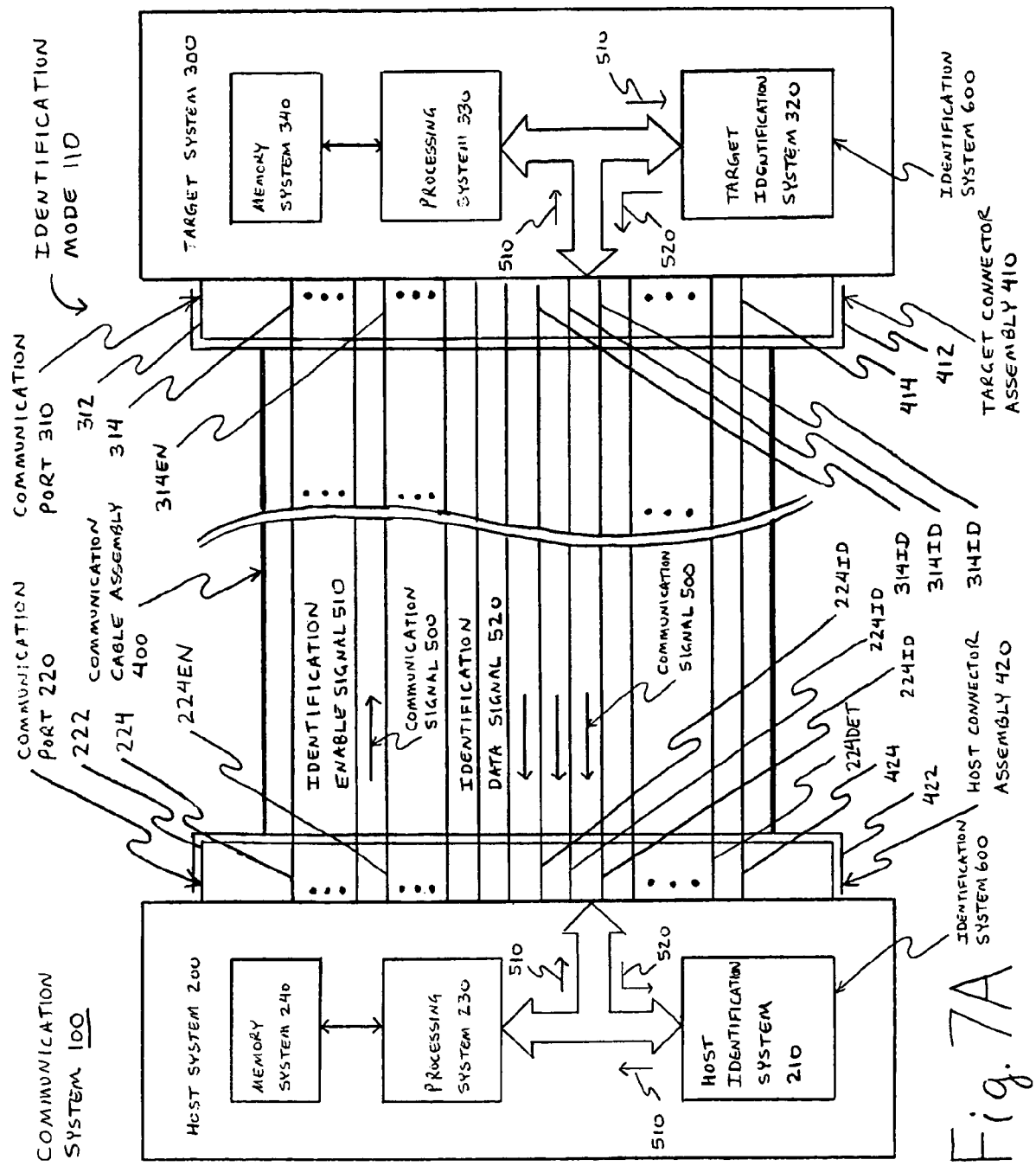
FIG. 7A is a detail drawing illustrating another alternate embodiment of the communication system of FIG. 2 in which the host system and the target system are coupled via a communication cable.
Figure 7B:
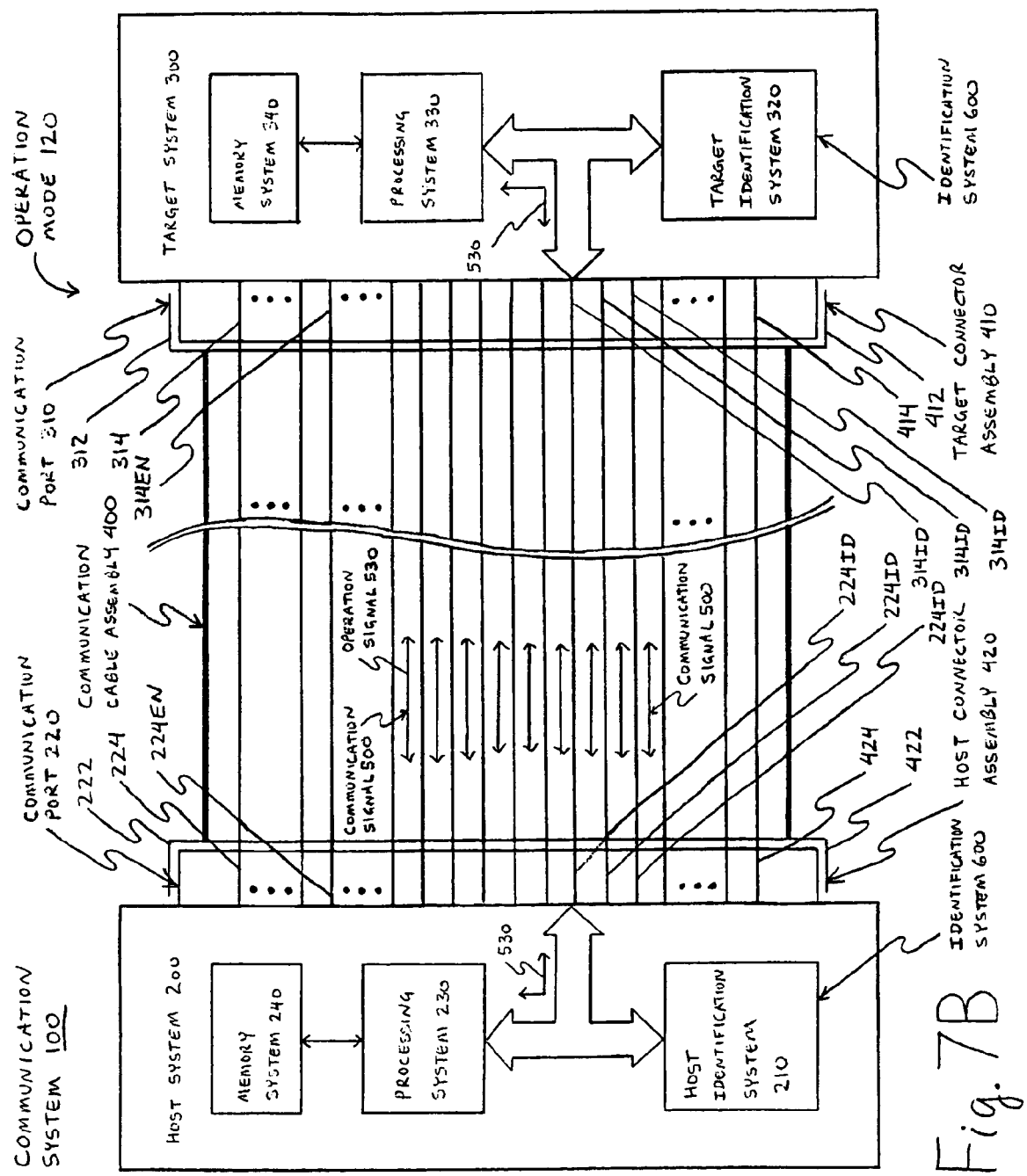
FIG. 7B is a detail drawing illustrating the communication system of FIG. 7A in the operation mode.

Turning to FIGS. 7A-B, the communication system 100 is shown with the host system 200 and the target system 300 coupled via the communication cable assembly 400. When the communication system 100 is properly assembled, the host connector assembly 420 of the communication cable assembly 400 is coupled with the communication port 220 of the host system 200; whereas, the target connector assembly 410 is coupled with the communication port 310 of the target system 300. In other words, the communication cable assembly 400 can couple the communication port 220 of the host system 200 with the communication port 310 of the target system 300. At least one communication signal 500 thereby can be exchanged between the host system 200 and the target system 300 by way of the communication cable assembly 400.

FIG. 7A illustrates the communication system 100 in the identification mode 110. In the identification mode 110, at least one selected terminal 224, such as terminal 224EN as shown in FIG. 7A, of the communication port 220 of the host system 200 is configured to provide the identification enable signal 510 from the host identification system 210. Although any suitable number of the terminals 224 can be configured to provide the identification enable signal 510, the identification enable signal 510 preferably is provided via one terminal 224EN. The use of a single terminal 224EN is preferred because the terminal 224EN preferably is dedicated and/or reserved for providing the identification enable signal 510 and because the number of terminals 224 associated with the communication port 220 typically is not unlimited. Therefore, when the communication system 100 is in the operation mode 120 (shown in FIG. 7B), for example, the terminal 224EN preferably is not configured to provide and/or receive the operation signals 530 (shown in FIG. 7B).

The terminal 224EN of the communication port 220 can be coupled with at least one selected terminal 314, such as terminal 314EN as shown in FIG. 7A, of the communication port 310 via the communication cable assembly 400. The target system 300, and thus the target identification system 320, thereby can be configured to receive the identification enable signal 510 from the host system 200. As set forth above with reference to the terminal 224EN, the terminal 314EN preferably is dedicated and/or reserved for receiving the identification enable signal 510 such that the terminal 314EN is not configured to provide and/or receive the operation signals 530 when the communication system 100 is in the operation mode 120. Therefore, since the number of terminals 314 associated with the communication port 310 typically is not unlimited, the target identification system 320 preferably is configured to receive the identification enable signal 510 via one terminal 314EN. Although shown and described with reference to FIGS. 7A-B as comprising a single terminal 314EN for purposes of illustration, any suitable number terminals 314 of the communication port 310 can be configured to receive the identification enable signal 510.

One or more selected terminals 314, such as terminals 314ID as shown in FIG. 7A, of the communication port 310 of the target system 300 likewise can be configured to provide the identification data signal 520 from the target identification system 320. Any suitable number of the terminals 314 can be configured to provide the identification data signal 520. The number of the terminals 314ID can be based, at least in part, on the nature of the information regarding the target system characteristics of the target system 300, which information is included with the identification data signal 520. In contrast to the terminal 314EN that is associated with the identification enable signal 510, the terminals 314ID generally are not dedicated and/or reserved for providing the identification data signal 520. In other words, the communication system 100 can configure the terminals 314ID to provide and/or receive other communication signals 500 as desired. When the communication system 100 is in the operation mode 120 (shown in FIG. 7B), for example, the terminals 314ID can provide and/or receive the operation signals 530 (shown in FIG. 7B).

The terminals 314ID of the communication port 310 likewise can be coupled with one or more selected terminals 224, such as terminals 224ID as shown in FIG. 7A, of the communication port 220 via the communication cable assembly 400. Thereby, the host system 200, and therefore the host identification system 210, can be configured to receive the identification data signal 520 from the target system 300. As discussed above regarding the terminals 314ID, the terminals 224ID generally are not dedicated and/or reserved for receiving the identification data signal 520 and can be configured to provide and/or receive other communication signals 500 as desired. Although any suitable number of the terminals 224 can be configured to receive the identification data signal 520, the number of the terminals 224ID can be based, at least in part, on the nature of the information regarding the target system characteristics provided by the identification data signal 520 and preferably is equal to the number of terminals 314ID.

The information provided by the identification data signal 520 can comprise any suitable number and/or type of target system characteristics that may be used for identifying the target system 300. Exemplary target system characteristics can include one or more general characteristics, such as a system type, a system model, and/or a system serial number, of the target system 300. One or more operational characteristics, such as a hardware version, a software version, and/or an operational status, and/or one or more external characteristics, such as a physical location of the target system 300 and/or a communication port 310 of the target system 300 that is coupled with the host system 200 likewise can be provided as a target system characteristic. Any suitable type of system characteristic can comprise a target system characteristic as desired. The examples of the target system characteristics are provided herein for purposes of illustration and not for purposes of limitation.

The information regarding the target system characteristics as provided by the identification data signal 520 can be fixed and/or adjustable, as desired. Preferably, the identification data signal 520 can be modified to accommodate information regarding the target system characteristics if changes are subsequently made to the target system 300. The identification data signal 520 can be updated, for example, to comprise information regarding the target system characteristics for future system types of the target system 300. Information regarding system upgrades, such as new hardware and/or software revisions, of the target system 300 likewise can be included with the identification data signal 520.

The identification data signal 520 can provide the information with regard to the target system characteristics in any suitable manner. For example, the target system characteristics each can be provided serially and/or in parallel via a selected number of terminals 314 of the communication port 310. Each of the target system characteristics likewise can be received by a selected number of terminals 224 of the communication port 220 serially and/or in parallel. The selected number of terminals 314 and the selected number of terminals 224 associated with each target system characteristic can be uniform and/or different among the target system characteristics. In the manner discussed above, the selected number of terminals 314 and the selected number of terminals 224 associated with each target system characteristic likewise can at least partially be related to the nature of the target system 300, including the nature of one or more software components and/or the nature of one or more hardware components of the target system 300.

Figure 8:
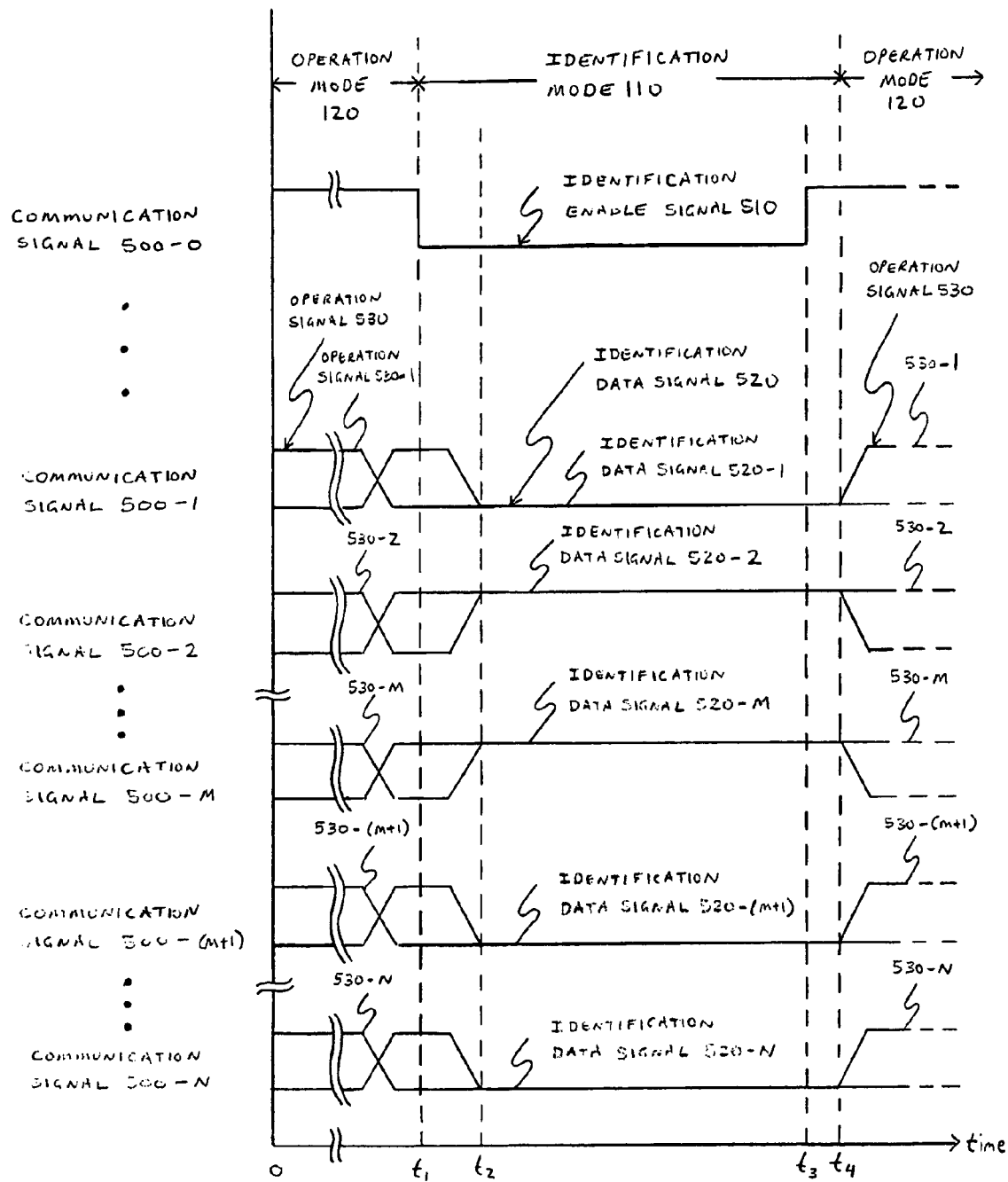
FIG. 8 is an exemplary timing diagram illustrating the operation of the communication system of FIGS. 7A-B.

FIG. 8 is a timing diagram that illustrates N+1 communication signals 500-0-500-N. The communication signal 500-0 is associated with the identification request signal 510; whereas, the communication signals 500-1-500-N can be associated with the identification data signals 520-1-520-N when the communication system 100 (shown in FIGS. 7A-B) is in the identification mode 110 and with the operation signals 530-1-530-N when the communication system 100 is in the operation mode 120. As shown in FIG. 8, the identification request signal 510 can comprise a digital (or logic) signal, and/or the identification data signal 520 can comprise one or more digital (or logic) signals. Each logic signal can comprise any type of logic signal, such as a transistor-transistor logic (TTL) signal or an emitter-coupled logic (ECL) signal, and can have any appropriate number of distinct logic levels, preferably at least two logic levels, such as a low logic level and a high logic level as shown in FIG. 8. The high logic level can comprise any voltage level, such as 1 VDC, 3.3 VDC, or 5 VDC, that is greater than the low logic level, which typically is associated with ground potential (0 VDC). The high logic levels and the low logic levels of the identification request signal 510 and the identification data signal 520 preferably are uniform and, as desired, may be uniform and/or differ among the logic signals.

The identification enable signal 510 can be provided on the relevant terminal 224 (shown in FIGS. 7A-B) of the communication port 210 (shown in FIGS. 7A-B) and is illustrated in FIG. 8 as having two signal states. When the communication system 100 is in the identification mode 110, the identification enable signal 510 is associated with a first signal state; otherwise, the identification mode 110 can be associated with a second signal state. Stated somewhat differently, the identification enable signal 510 can enter and/or maintain a first signal state in the identification mode 110 and a second signal state in the operation mode 120. Although the first and second signal states are shown and described with reference to FIG. 8 as being respectively associated with the high and low logic levels for purposes of illustration, the first and second signal states of the identification enable signal 510 can be associated with any logic level, as desired, such that the logic level of the first signal state is distinguishable from the logic level of the second signal state. The communication signal 500-0 is illustrated as comprising the identification request signal 510 regardless of whether the communication system 100 is in the identification mode 110 or the operation mode 120.

Similarly, N communication data signals 500-1-500-N can be associated with selected terminals 224 of the communication port 210 and the selected terminals 314 (shown in FIGS. 7A-B) of the communication port 310 (shown in FIGS. 7A-B). When the communication system 100 is in the identification mode 110, the communication data signals 500-1-500-N can comprise the identification data signals 520-1-520-N. Otherwise, the communication data signals 500-1-500-N include the operation signals 530-1-530-N, which can be exchanged between the communication port 210 and the communication port 310, when the communication system 100 is in the operation mode 120. As shown in FIG. 8, the communication data signals 500-1-500-N can comprise the identification data signals 520-1-520-N before comprising the operation signals 530-1-530-N and/or after comprising the operation signals 530-1-530-N, as desired. Thereby, the communication system 100 can be configured to confirm the identity of a previously-identified target system 300 (shown in FIGS. 7A-B).

The communication system 100 can initiate identification of the target system 300 by entering and/or maintaining the identification mode 110 at any suitable time. Stated somewhat differently, the host system 200 can be configured to assert the identification request signal 510 with the low signal state in accordance with any appropriate predetermined criteria. For example, the communication system 100 can initiate identification of the target system 300 at one or more preselected time intervals and/or at the occurrence of one or more predetermined events. Exemplary predetermined events can include an initial powering up of the communication system 100, in whole or in part, and/or an initial exchange of the operation signal 530 (shown in FIG. 7B) between the host system 200 (shown in FIGS. 7A-B) and the target system 300. If the host system 200 comprises a conventional design verification system for developing the target system 300, the configuration of the target system 300 and/or the initiation of a simulation and/or emulation can comprise predetermined events for initiating identification of the target system 300.

Identification of the target system 300 likewise can be initiated when the target system 300 is initially coupled with the host system 200. The identification system 600 can determine that the host system 200 and the target system 300 have been coupled in any conventional manner such as via a target detect signal (not shown). In the manner known in the art, the target detect signal can be associated with a selected terminal 224, such as terminal 224DET (shown in FIG. 7A), of the communication port 220 and can be configured to transition from a first predetermined signal state to a second predetermined signal state when the host system 200 and the target system 300 are coupled. By examining the state of the target detect signal, the host system 200 can determine when the target system 300 has been coupled with the host system 200 and, as desired, initiate identification of the target system 300.

Although exchanges of communication signals 500 are described as being between the host system 200 and the target system 300 for purposes of clarity, a reference to the host system 200 comprises a reference to the host system 200 and/or a reference to a relevant portion of the identification system 600 (shown in FIGS. 7A-B) when the communication system 100 is in the identification mode 110. A reference to the host system 200 providing the identification request signal 510 therefore may include the identification request signal 510 being provided by the host identification system 210 (shown in FIGS. 7A-B); whereas, a reference to the host system 200 receiving the identification data signal 520 can include the host identification system 210 receiving the identification data signal 520. When the communication system 100 is in the identification mode 110, a reference to the target system 300 likewise preferably comprises a reference to the target system 300 and/or a reference to a relevant portion of the identification system 600. A reference to the target system 300 receiving the identification request signal 510 therefore can include the target identification system 320 (shown in FIGS. 7A-B) receiving the identification request signal 510. Similarly, a reference to the target system 300 providing the identification data signal 520 can include the identification data signal 520 being provided by the target identification system 320.

As illustrated in FIG. 8, the identification request signal 510 is shown as transitioning from the high signal state to the low signal state at selected time $t_1$. When the host system 200 asserts the identification request signal 510 with the low signal state, the communication system 100 can inhibit any exchange of the operation signal 530 between the host system 200 and the target system 300 and can initiate identification of the target system 300 by entering the identification mode 110. In the identification mode 110, the target system 300 is configured to respond to the identification request signal 510 by providing the identification data signal 520 at selected time $t_2$ as shown in FIG. 8. The communication data signal 500 therefore is illustrated as comprising the N identification data signals 520-1-520-N, which can be configured to provide up to N data bits representing the information regarding the target system characteristics of the target system 300. The information regarding the target system characteristics can be encoded into the data bits in any conventional manner.

The target system 300 preferably is configured to continue to provide the identification data signals 520-1-520-N while the communication system 100 maintains the identification mode 110 as shown in FIG. 8. Thereby, the host system 200 can receive the identification data signals 520-1-520-N and, therefore, the information regarding the target system characteristics of the target system 300. Upon receiving the identification data signals 520-1-520-N, the host system 200 can attempt to identify the target system 300 based, in whole and/or in part, upon the information regarding the target system characteristics. At selected time $t_3$, the identification request signal 510 is shown as transitioning from the low signal state to the high signal state. The host system 200 can be configured to assert the identification request signal 510 with the high signal state in accordance with any appropriate predetermined criteria. For example, the communication system 100 can initiate the operation mode 120 at one or more preselected time intervals, such as a selected time interval after the identification mode 110 has been initiated, and/or when the target system 300 has been identified. In the operation mode 120, the host system 200 and the target system 300 are configured to exchange operation signals 530 in a conventional manner beginning at selected time $t_4$ as shown in FIG. 8.

Figure 9A:
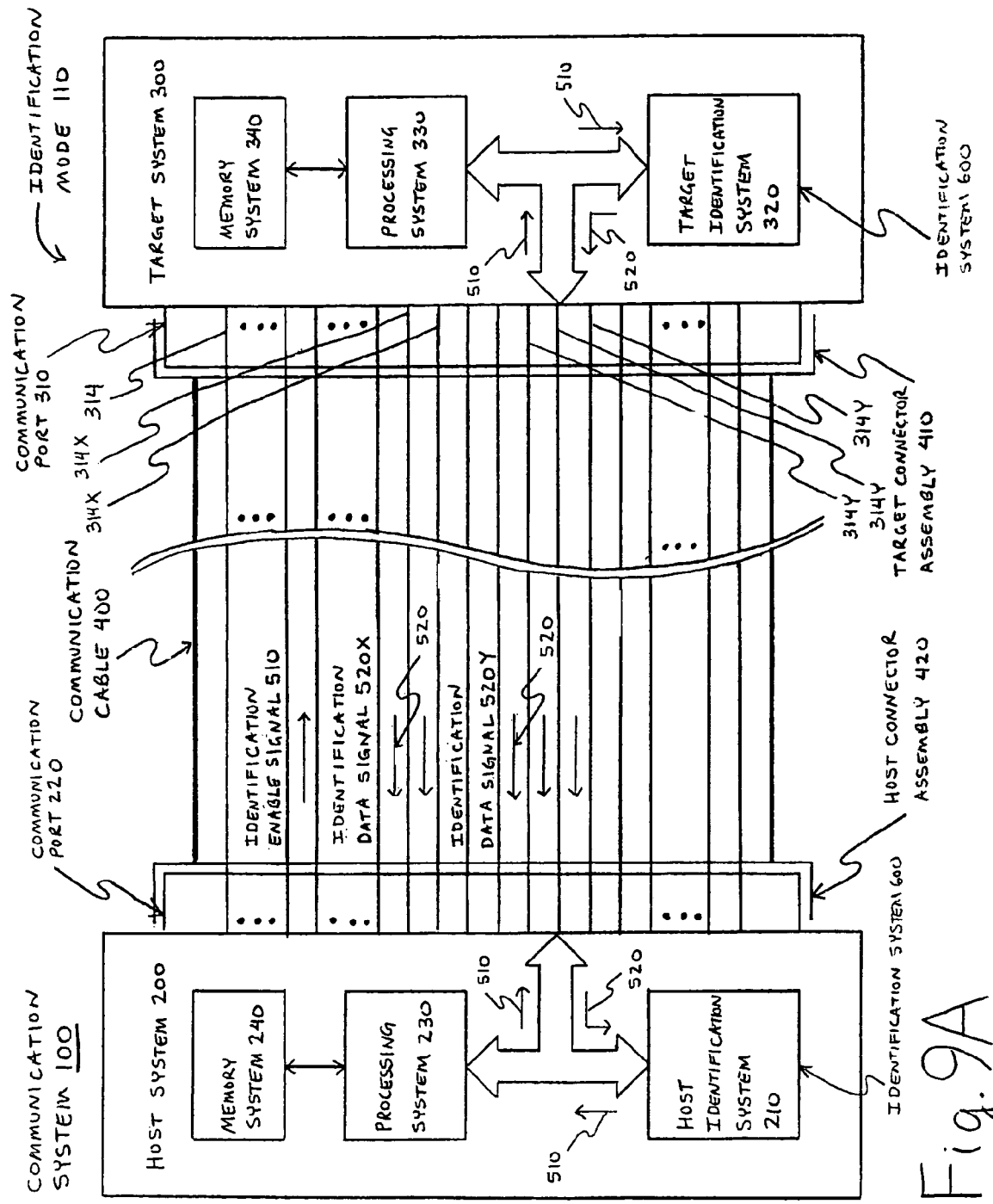
FIG. 9A is a detail drawing illustrating an embodiment of the communication system of FIGS. 7A-B in which the identification system comprises a hierarchical identification system.
Figure 9B:
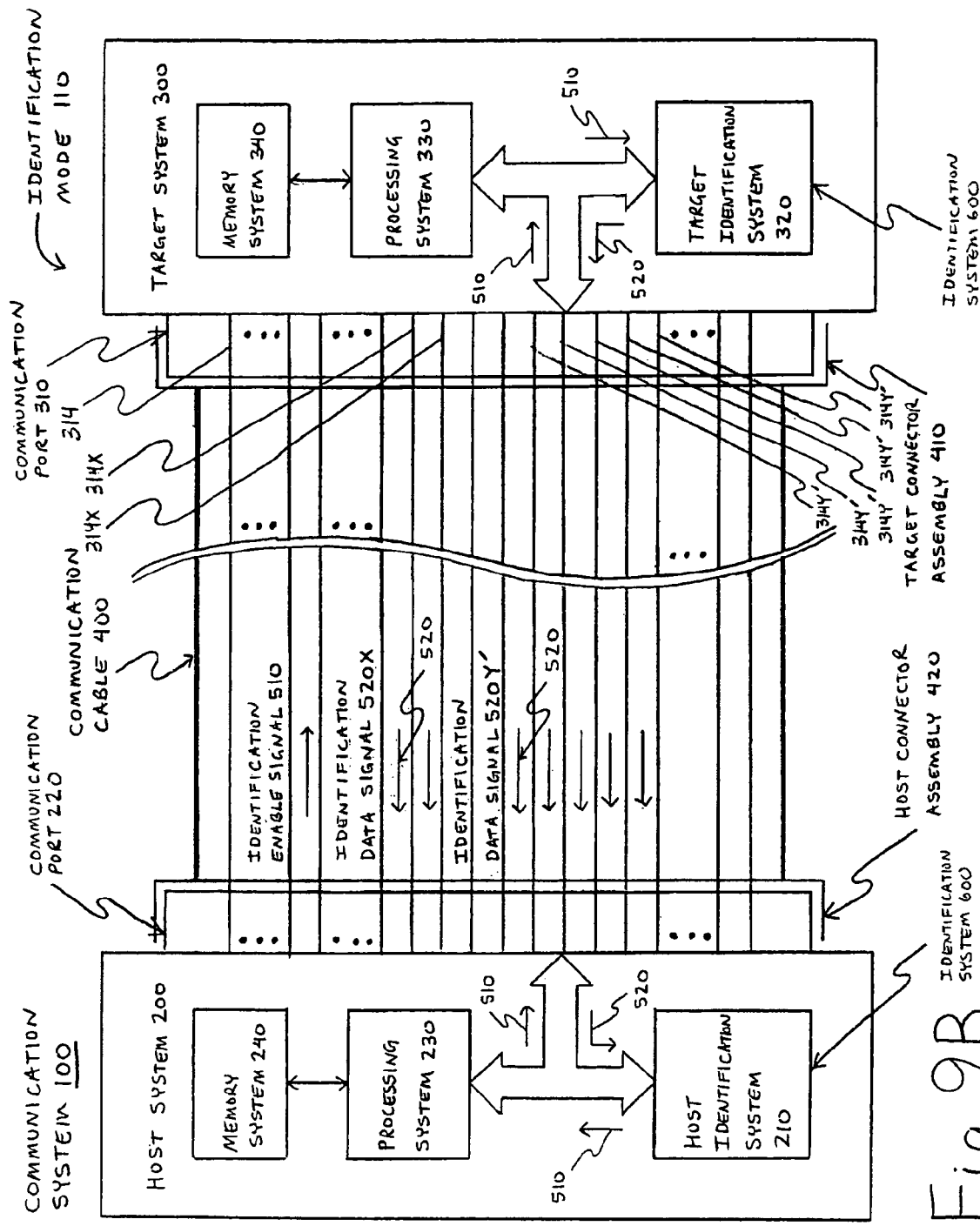
FIG. 9B is a detail drawing illustrating an alternative embodiment of the hierarchical identification system of FIG. 9A.
Figure 9C:
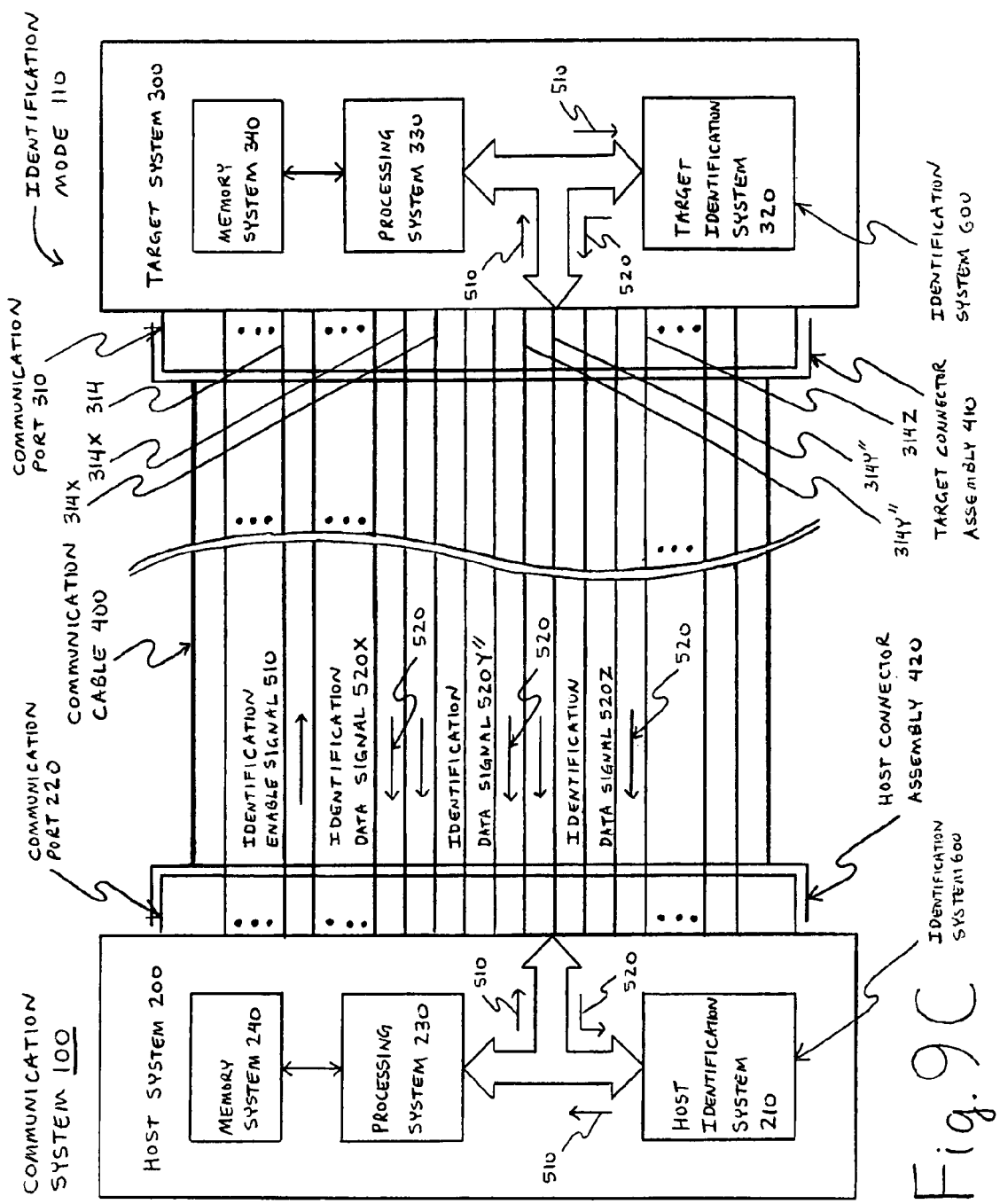
FIG. 9C is a detail drawing illustrating another alternative embodiment of the hierarchical identification system of FIG. 9A.

When the identification system 600 is configured to identify the target system 300 via a plurality of target system characteristics, the identification data signal 520 preferably comprises a hierarchical identification data signal 520 as illustrated in FIGS. 9A-C. Turning to FIG. 9A, the identification data signal 520 comprises a first identification data signal 520X and a second identification data signal 520Y. The first identification data signal 520X can be associated with a first target system characteristic of the target system 300 and can comprise, for example, one or more of the M identification data signals 520-1-520-M (shown in FIG. 8). Being provided via two selected terminals 314X of the communication port 310, the first identification data signal 520X thereby can include information regarding the first target system characteristics to the host system 200. Since the first identification data signal 520X is provided via two terminals 314X, the first target system characteristic is represented by two data bits, and the first identification data signal 520X can represent up to four alternative first target system characteristics of the target system 300.

The second identification data signal 520Y likewise can be associated with a second target system characteristic of the target system 300 and can comprise, for example, one or more of the N-M identification data signals 520-(M+1)-520-N (shown in FIG. 8). The second target system characteristic can be used in conjunction with the first target system characteristic to further identify the target system 300. If the first target system characteristic comprises a selected system type of the target system 300, the second target system characteristic can be a system model of the target system 300 having the selected system type. As shown in FIG. 9A, the second identification data signal 520Y can be provided via three selected terminals 314Y of the communication port 310. Being configured to provide information regarding the second target system characteristics to the host system 200, the second identification data signal 520Y represents the second target system characteristic by three data bits. In the manner set forth above with regard to the first identification data signal 520X, the second identification data signal 520Y thereby can represent up to eight alternative second target system characteristics of the target system 300.

The target system characteristics can be uniform and/or different among the various target systems 300 that can be coupled with host system 200. For example, the number and/or type of alternative target system characteristics associated with a selected target system characteristic can vary among target systems 300. The number of selected terminals 314X of the communication port 310 therefore can be controlled, as desired, to adjust the number of the first target system characteristics that can be represented by the first identification data signal 520X. The number of the second target system characteristics that can be represented by the second identification data signal 520Y likewise can be adjusted by controlling the number of selected terminals 314Y. The number of selected terminals 314X and the number of selected terminals 314Y can be independently and/or cooperatively adjustable; however, the selected terminals 314X, 314Y associated with at least one of the identification data signals 520 preferably are fixed in number.

FIGS. 9A-C illustrate a manner in which the number of selected terminals 314X, 314Y can be adjusted to control the number of the target system characteristics that can be represented by the selected identification data signals 520X, 520Y. As discussed above with reference to FIG. 9A, the second identification data signal 520Y is associated with three selected terminals 314Y and therefore can represent up to eight alternative second target system characteristics. The second identification data signal 520Y' is shown in FIG. 9B as being associated with five selected terminals 314Y' and as being configured to represent up to thirty-two alternative second target system characteristics in the manner set forth above with regard to the second identification data signal 520Y. FIG. 9C likewise illustrates the second identification data signal 520Y" as being associated with two selected terminals 314Y" and as being configured to represent up to four alternative second target system characteristics. Whereas the number of the target system characteristics that can be represented by the second identification data signal 520Y is adjustable in FIGS. 9A-C, the number of selected terminals 314X associated with the first identification data signal 520X remains fixed at two such that the first identification data signal 520X can represent up to four alternative first target system characteristics as discussed above with reference to FIG. 9A.

Although the hierarchical identification data signal 520 can include any appropriate number of hierarchical levels, FIG. 9A illustrates a two-level hierarchical system of the identification data signals 520. The first identification data signal 520X can be associated with a general level of target system characteristics, such as a system type, of the target system 300; whereas, the second identification data signal 520Y can be associated with a level of target system characteristics that is more specific than the level of target system characteristics associated with the first identification data signal 520X. Stated somewhat differently, the second target system characteristics represented by the second identification data signal 520Y preferably are more specific than the first target system characteristics represented by the first identification data signal 520X. The second identification data signal 520Y likewise can be associated with other types of target system characteristics, such as an operation characteristic and/or a physical (or external) characteristic, that is less directly related to the level of target system characteristics associated with the first identification data signal 520X. The exemplary hierarchical arrangements of the identification data signal 520 are provided herein for purposes of illustration and not for purposes of limitation.

For example, FIG. 9C illustrates a three-level hierarchical system of the identification data signals 520. As discussed above, the first and second identification data signals 520X, 520Y" each are shown as being respectively associated with two selected terminals 314X, 314Y" of the communication port 220 and therefore can represent up to four alternative target system characteristics. In addition, the identification data signals 520 further include a third identification data signal 520Z. The third identification data signal 520Z is shown in FIG. 9C as being associated with one selected terminal 314Z of the communication port 220 and as being configured to represent up to two alternative third target system characteristics in the manner set forth above.

If the first identification data signal 520X is associated with the general level of target system characteristics as discussed above, exemplary hierarchical arrangements can include the identification data signals 520Y", 520Z each being associated with a level of target system characteristics that is more specific than the general level of first target system characteristics. The second target system characteristics represented by the second identification data signal 520Y" can be more specific than, less specific than, and/or equally specific with the third target system characteristics represented by the third identification data signal 520Z. For example, the third identification data signal 520Z can be associated with a level of target system characteristics that is more specific than the level of target system characteristics associated with the second identification data signal 520Y". The second and third identification data signals 520Y", 520Z likewise can be associated with other types of target system characteristics, such as an operation characteristic and/or a physical (or external) characteristic, that is less directly related to the level of target system characteristics associated with the first identification data signal 520X.

Returning to FIG. 7A, the target system 300 can provide the identification data signal 520 to the host system 200 and, therefore, to the host identification system 210. In the manner set forth above, the host identification system 210 is configured to receive the identification data signal 520 and thereby to attempt to identify the target system 300. The host identification system 210 can attempt to identify the target system 300 in any conventional manner, preferably by decoding one or more of the target system characteristics associated with the identification data signal 520. For example, the host identification system 210 can include a processing system and/or a memory system for decoding the identification data signal 520 and/or for identifying the target system 300. If the host identification system 210 is at least partially integrated with the host system 200, the processing system 230 and/or memory system 240 of the host system 200 can be configured to decode the identification data signal 520 and/or to identify the target system 300. The host identification system 210 can decode the identification data signal 520 and/or identify the target system 300 in any conventional manner, such as a look-up table system and/or a database system. Thereby, the host identification system 210 can identify one or more software components and/or one or more hardware components of the target system 300 and can provide the identification information to one or more software components and/or one or more hardware components of the host system 200.

Upon identifying the target system 300, the host identification system 210 likewise can be configured to at least partially reconfigure one or more software and/or hardware components of the host system 200, as necessary, such that the host system 200 can be compatible with the target system 300. For example, selected terminals 224 of the communication port 220 can be reconfigurable for input, output, or bidirectional communication signals 500. The host identification system 210 therefore can configure the communication port 220 of the host system 200 to be compatible with the communication port 310 of the target system 300. The processing system 230 and/or the memory system 240 likewise can be reconfigured, as needed, to facilitate an exchange of communication signals 500 between the host system 200 and the target system 300. The host identification system 210, for instance, can select instruction code from the memory system 240. The instruction code is suitable for execution by the processing system 230 when the host system 200 is coupled with the target system 300. Any conventional manner, such as a look-up table system and/or a database system, can be used to reconfigure the host system 200, to be compatible with the target system 300.

The communication system 100 can enter and/or maintain the operation mode 120 as shown in FIG. 7B once the target system 300 has been identified and after the host system 200 is configured to be compatible with the identified target system 300. Upon entering the operation mode 120, the host system 200 and the target system 300 can exchange one or more operation signals 530 in the conventional manner. If the host system 200 comprises a conventional design verification system for developing the target system 300, for example, a user design can be implemented via the target system 300 and the exchange of the operation signals 530 can comprise simulation signals and/or emulation signals exchanged between the user design and an emulation environment provided by the host system 200. The communication system 100 thereby can facilitate performance of in-circuit testing and/or in-system testing of the user design. As desired, the target system 300 can be decoupled from the host system 200, such as upon completion of the testing, and the host system can be coupled with a second target system 300. In the manner set forth in more detail above, the communication system 100 can be configured to attempt to identify the second target system 300 and to at least partially reconfigure the host system 200, as necessary, such that the host system 200 can be compatible with the second target system 300.

Figure 10:
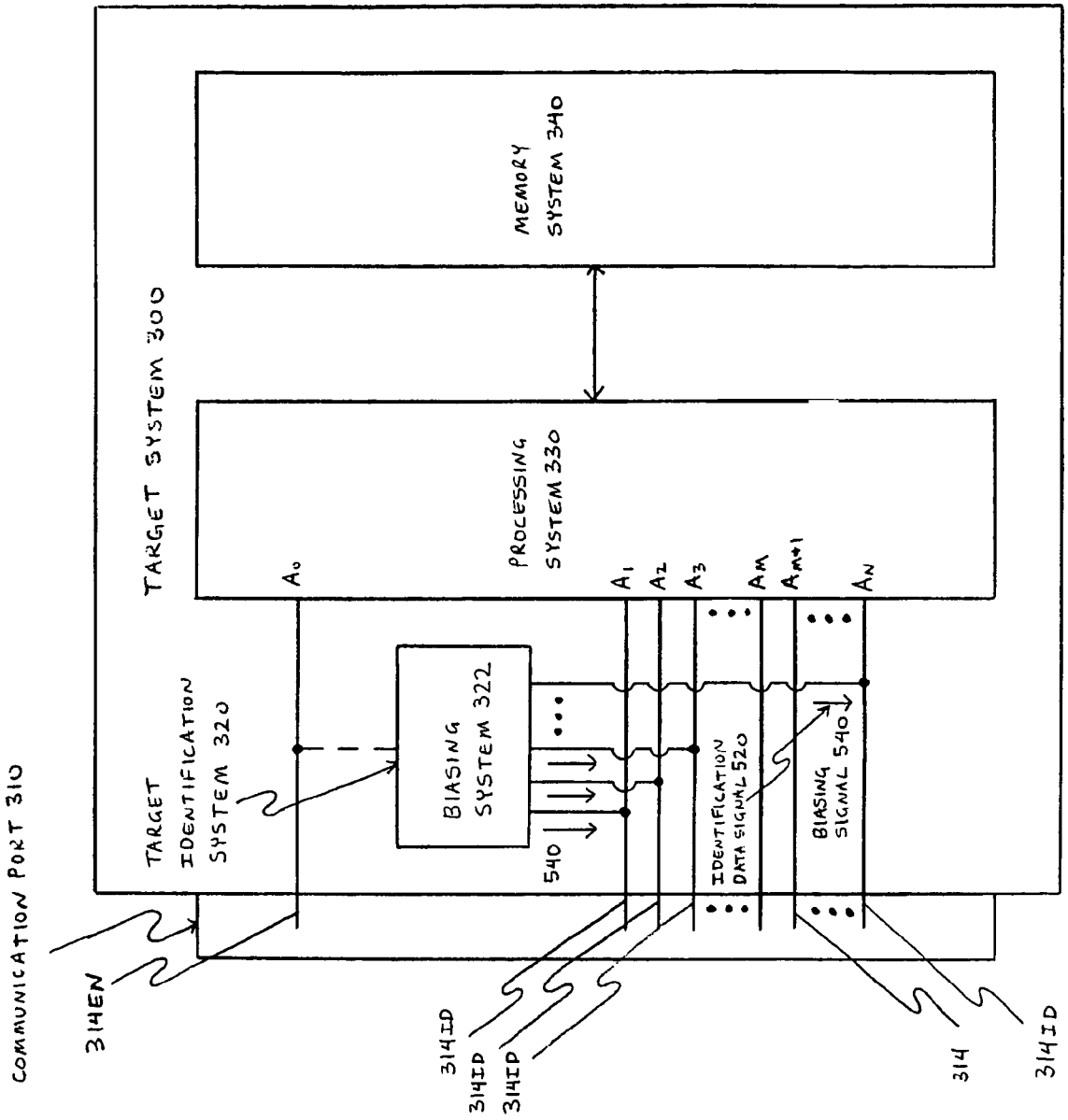
FIG. 10 is a detail drawing illustrating an alternate embodiment of the target system of FIG. 2 in which the identification system includes a biasing system for providing a biasing signal that includes information regarding one or more target system characteristics associated with the target system.

Turning to FIG. 10, the target identification system 320 is shown as comprising a biasing system 322 for providing a biasing signal 540. The biasing signal 540 can include information regarding the target system characteristics associated with the target system 300 in the manner set forth in more detail above with regard to the identification data signal 520 (shown in FIG. 7A). The biasing system 322 can communicate the biasing signal 540 to selected terminals 314, such as the terminals 314ID, of the communication port 310 of the target system 300, and, as desired, can be configured to receive the identification enable signal 510 (shown in FIG. 7A) from the host system 200 (shown in FIGS. 7A-B). The target system 300 thereby can provide the biasing signal 540 to the host system 200 as the identification data signal 520 when the communication system is in the identification mode 110. Based upon the target system characteristics included with the biasing signal 540, the communication system 100 can attempt to identify the target system 300 and to at least partially reconfigure the host system 200, as necessary, such that the host system 200 can be compatible with the target system 300 as discussed above with reference to FIG. 7A.

FIG. 10 illustrates the biasing system 322 as being coupled with one or more selected terminals 314 of the communication port 310. For example, the biasing system 322 can be coupled with the terminals 314ID to communicate the biasing signal 540 to the communication port 310 and, therefore, to the host system 200. The biasing system 322 likewise can receive the identification enable signal 510, as desired, by being coupled with the terminal 314EN of the communication port 310. Thereby, the biasing system 322 can be activated via the identification enable signal 510 when the communication system 100 enters and/or maintains the identification mode 100. Although shown and described as being coupled with the terminals 314EN, 314ID of the communication port 310 for purposes of illustration, the biasing system 322 can be coupled with any suitable number and/or configuration of terminals 314, including selected terminals 314 other than the terminals 314EN, 314ID.

As desired, the biasing system 322 can be separate from and/or at least partially integrated with one or more of the components, such as the processing system 330 and/or the memory system 340, of the target system 300. If separate from the processing system 330, the biasing system 322 can be disposed between, and coupled with, the processing system 330 and the communication port 310 in any conventional arrangement, such as a parallel arrangement and/or series arrangement. The biasing system 322 is shown in FIG. 10 as being coupled with one or more terminals $A_0$-$A_N$ of the processing system 330. Thereby, the communication port 310 can be configured to communicate with the biasing system 322 and/or the processing system 330, and the biasing system 322 can provide the biasing signal 540 to the communication port 310.

In at least the identification mode 110, the biasing signal 540 can bias the communication signal 500 associated with the selected terminals 314ID of the communication port 310. The biasing system 322 preferably biases the selected terminals 314ID such that the selected terminals 314ID are configured to provide the biasing signal 540 as the identification data signal 520. Thereby, when the communication system 100 is in the identification mode, the communication port 310 can provide the biasing signal 540 to the host system 200 as the identification data signal 520. For example, the processing system 330 can respond to the identification request signal 510 by placing the terminals $A_0$-$A_N$ in a high-impedance state such that the biasing signal 540 dominates the communication signal 500 associated with the selected terminals 314ID. The biasing signal 540 likewise preferably has a negligible effect on the operation and/or performance of the communication system 100 in the operation mode 120 such as the operation signal 530 (shown in FIG. 7B) can be exchanged between the host system 200 and the target system 300 in a conventional manner. Other components, such as the memory system 340, of the target system 300 can be coupled with, and configured to communicate with, the biasing system 322, as desired, in the manner set forth above.

Figure 11A:
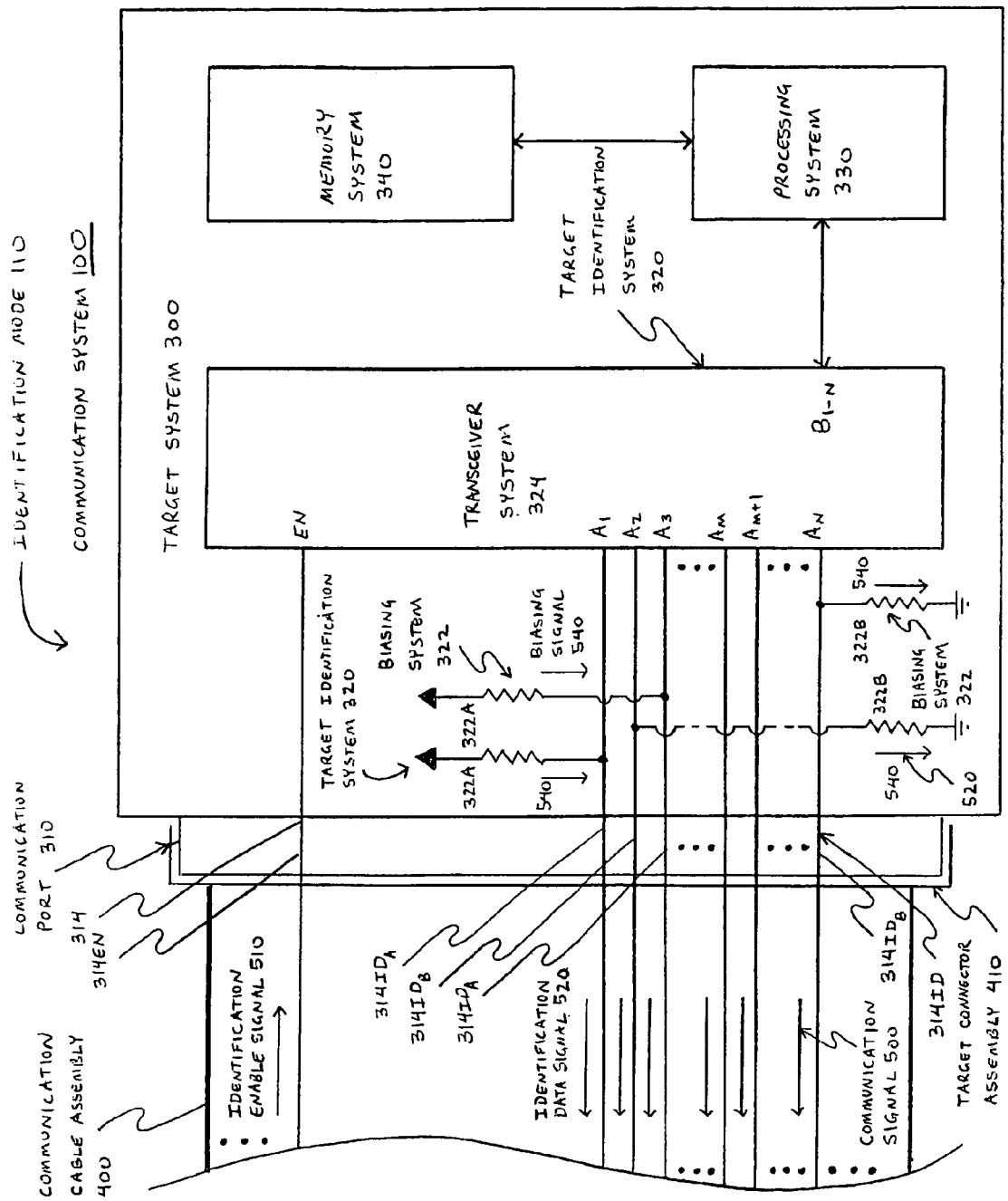
FIG. 11A is a detail drawing illustrating an alternative embodiment of the biasing system of FIG. 10 in which the biasing system comprises a passive biasing system.
Figure 11B:
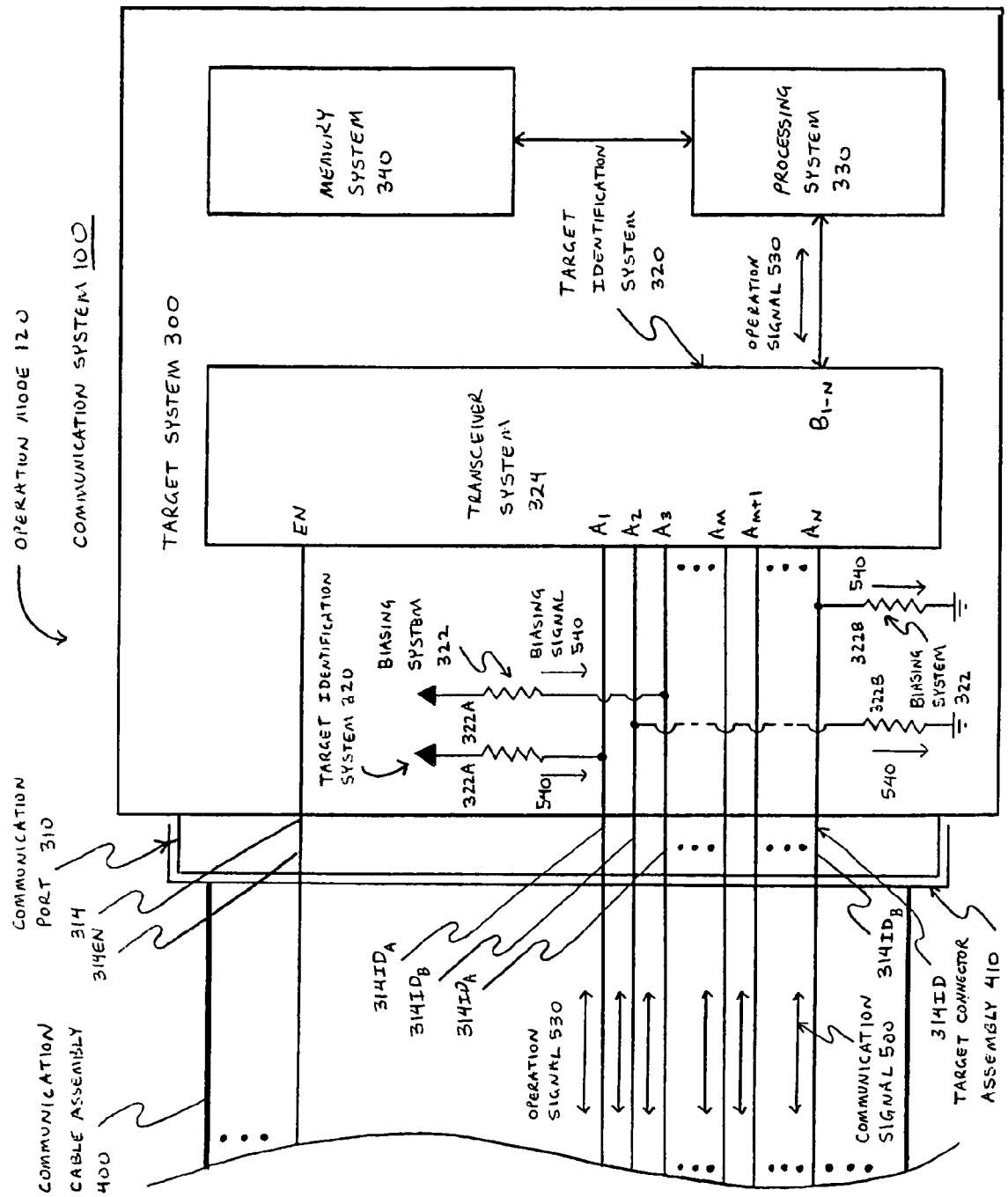
FIG. 11B is a detail drawing illustrating the biasing system of FIG. 11A when the communication system is in an operation mode.

The biasing system 322 preferably comprises a passive biasing system. For example, the biasing system 322 can be provided as a resistive biasing system that includes one or more resistive elements 322A, 322B as illustrated in FIGS. 11A-B. The resistive elements 322A, 322B can comprise any conventional type of electronic components, including passive components and/or semiconductor components, that can provide an impedance within a selected range of impedances. Exemplary passive components can include resistors, capacitors, and inductors; whereas, a transistor can be a suitable semiconductor component. As desired, the resistive elements 322A, 322B each can comprise one or more passive components and/or semiconductor components. If the processing system 330 comprises a field-programmable gate array (FPGA), for instance, the resistive elements 322A, 322B can be provided by configuring the input/output blocks (IOBs) of the field-programmable gate array in the manner that is well-known in the art.

The resistive elements 322A, 322B can be provided in any suitable arrangement and/or configuration such that the biasing system 322 can provide the biasing signal 540 to the communication port 310. As shown in FIG. 11A, the resistive elements 322A can be configured as pull-up resistive elements, and the resistive elements 322B are illustrated as being pull-down resistive elements. Although shown and described as being coupled with voltage reference for purposes of illustration, the resistive elements 322A can be coupled with any conventional type of reference source, including a current reference. In the manner set forth above with regard to the resistive elements 322A, the resistive elements 322B likewise can be coupled with a reference source, as desired. The output levels, such as the voltage levels and/or the current levels, of the reference sources associated with the resistive elements 322A can be uniform and/or differ from the output levels of any reference sources associated with the resistive elements 322B.

As illustrated in FIG. 11A, the resistive elements 322A, 322B likewise can be coupled with the terminals 314ID of the communication port 310 that are configured to provide the identification data signal 520. For example, selected terminals 314ID$_A$ of the terminals 314ID can be coupled with the resistive elements 322A and thereby can be biased to a first predetermined voltage level and, in the manner discussed above with reference to the identification enable signal 510 and the identification data signal 520, can be associated with a first signal state. Other selected terminals 314ID$_B$ likewise can be coupled with the resistive elements 322B. The resistive elements 322B can bias the selected terminals 314ID$_B$ to a second predetermined voltage level that can be associated with a second signal state and that is distinguishable from the predetermined voltage level of the first signal state. In the manner set forth above with reference to FIGS. 7A, 8, and 9A-C, the information regarding the target system characteristics can be encoded into the terminals 314ID of the communication port 310 by coupling the terminals 314ID$_A$, 314ID$_B$ with an appropriate number and/or arrangement of the resistive elements 322A, 322B.

The impedances of the resistive elements 322A, 322B preferably are selected such that the selected terminals 314ID$_A$, 314ID$_B$ can be biased to the appropriate signal state. Thereby, when the communication system 100 is in the identification mode, the resistive elements 322A, 322B can bias the selected terminals 314ID$_A$, 314ID$_B$ to the appropriate signal state to provide the information regarding the target system characteristics. In the manner discussed in more detail above with reference to FIG. 10, the processing system 330 can respond to the identification request signal 510 by placing the terminals $A_0$-$A_N$ (shown in FIG. 10) of the processing system 330 in a high-impedance state such that the information regarding the target system characteristics dominates the selected terminals 314ID. The resistive elements 322A, 322B likewise preferably have a negligible effect on the operation and/or performance of the communication system 100 in the operation mode 120 such that the operation signal 530 can be exchanged between the host system 200 and the target system 300 in a conventional manner as shown in FIG. 11B.

Each resistive element 322A, 322B is configured to provide an impedance that is within a selected range of impedances. Typically being less than or equal to one megohm (1 MΩ), the impedance of each resistive element 322A, 322B can comprise any suitable impedance, including impedances that are greater than one megohm (1 MΩ), as desired. Each resistive element 322A, 322B preferably has an impedance that is between approximately one kilohm (1 kΩ) and one hundred kilohms (100 kΩ), inclusive. The impedance of each resistive element 322A, 322B can be approximately within any suitable range, including, for example, any five kilohm (5 kΩ) range, such as the range between ten kilohms (10 kΩ) and fifteen kilohms (15 kΩ), between one kilohm (1 kΩ) and one megohm (1 MΩ). The selected range of impedances can be uniform and/or differ among the resistive elements 322A, 322B.

The biasing system 322 can be directly and/or indirectly coupled with the components, such as the processing system 330 and/or the memory system 340, of the target system 300. Stated somewhat differently, the target identification system 320 can include one or more discrete components and/or integrated components for coupling the biasing system 322 and the components of the target system 300. For example, the target identification system 320 is shown in FIGS. 1A-B as having a signal processing system, such as a conventional buffer or transceiver system 324, for coupling the biasing system 322 and the processing system 330. The exemplary transceiver system 324 includes one or more terminals $A_0$-$A_N$ for coupling with the biasing system 322 and one or more terminals $B_0$-$B_N$ for coupling with the processing system 330. An enable terminal EN of the transceiver system 324 can be coupled with the terminal 314EN of the communication port 310 and configured to receive the identification request signal 510. As desired, the identification request signal 510 likewise can be provided to the processing system 530 directly in the manner set forth above and/or indirectly via the transceiver system 324.

Being received via the enable terminal EN, the identification request signal 510 can control the operation of the transceiver system 324 in the conventional manner. When the communication system 100 is in the identification mode 110, the identification request signal 510 preferably is configured to disable the transceiver system 324. The terminals $A_0$-$A_N$ and the terminals $B_0$-$B_N$ thereby are inhibited from exchanging the communication signal 500 and preferably are configured to enter a high-impedance state as illustrated in FIG. 11A. Therefore, the selected terminals 314ID of the communication port 310, being biased by the resistive elements 322A, 322B, can provide the identification data signal 520 with the information regarding the target system characteristics as discussed in more detail above with reference to FIG. 10. The communication port 310 can be configured to provide the information regarding the target system characteristics while the communication system 100 maintains the identification mode 110.

In the operation mode 120, the identification request signal 510 can be configured to enable the transceiver system 324. When enabled, the transceiver system 324 can exchange the communication signal 500 between the terminals $A_0$-$A_N$ and the terminals $B_0$-$B_N$. The transceiver system 324 therefore is configured to permit the operation signal 530 to be exchanged between the processing system 330 of the target system 300 and the selected terminals 314ID of the communication port 310 as shown in FIG. 11B. The host system 200 and the target system 300 thereby can exchange the operation signal 530 in the manner set forth above with reference to FIG. 7B. As discussed above, the resistive elements 322A, 322B preferably have a negligible effect on the operation and/or performance of the communication system 100 in the operation mode 120, and the operation signal 530 can be exchanged between the host system 200 and the target system 300 in a conventional manner.

Figure 12A:
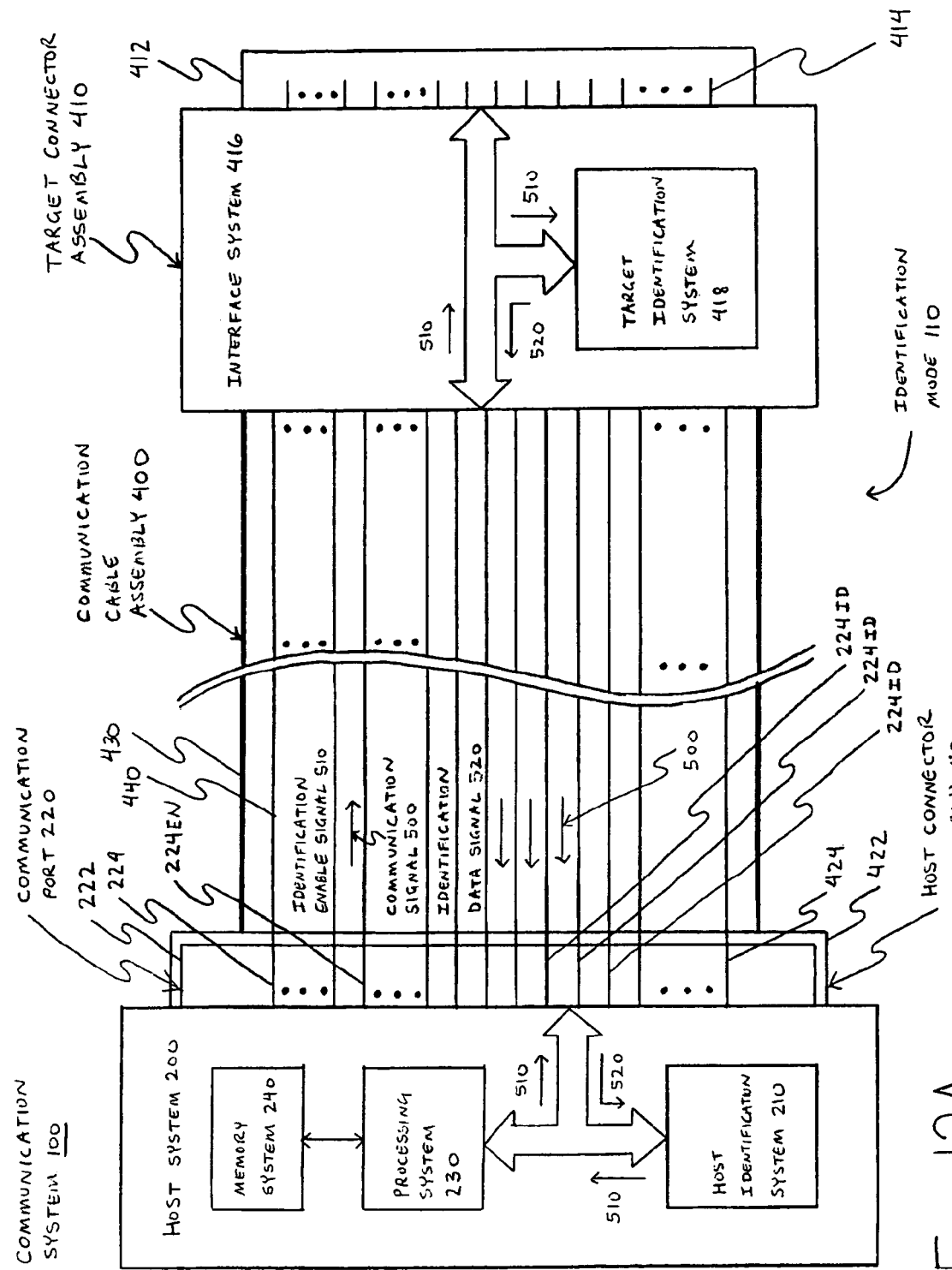
FIG. 12A is a detail drawing illustrating an alternate embodiment of the identification system of FIG. 2 in which the identification system is at least partially incorporated with the communication cable assembly.
Figure 13:
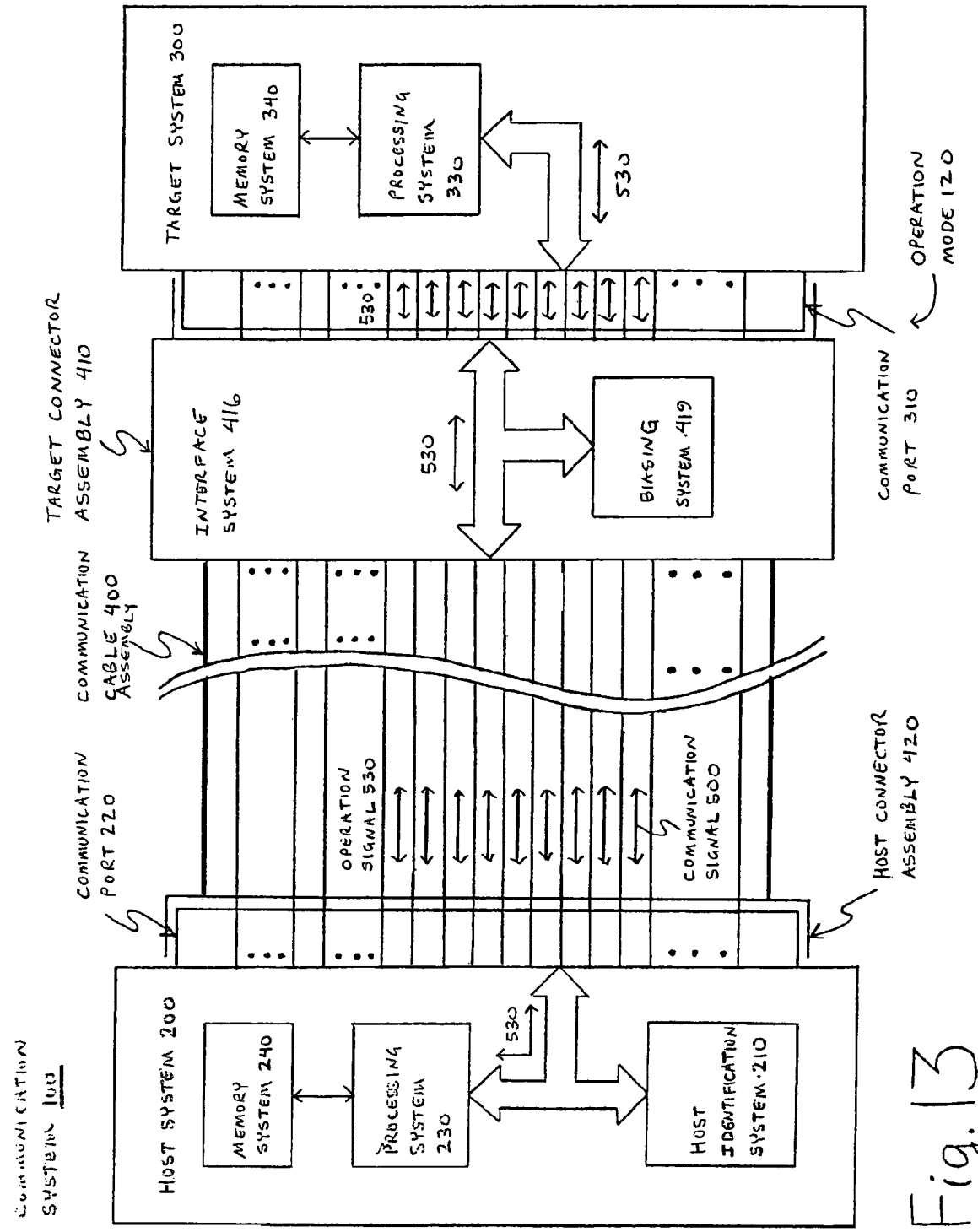
FIG. 13 is a detail drawing illustrating another alternate embodiment of the communication system of FIG. 2 in which the identification system comprises a biasing system.

As discussed above with reference to FIGS. 3B and 5B, the identification system 600 can be separate from the host system 200 and/or the target system 300. The identification system 600, in whole or in part, therefore can be associated with the communication cable assembly 400 as desired. For example, the target identification system 320 can be at least partially disposed in the target connector assembly 410 of the communication cable assembly 400. As shown in FIG. 12A, the target connector assembly 410 can include an interface system 416 having a target identification system 418. The interface system 416 can be coupled with, and configured to communicate with, the communication cable 430 and the connector assembly 412. The target identification system 418 preferably comprises a biasing system 419 as illustrated in FIG. 13. The biasing system 419 can be provided in the manner discussed in more detail above with reference to the biasing system 322 (shown in FIGS. 10 and 11A-B).

Figure 12B:
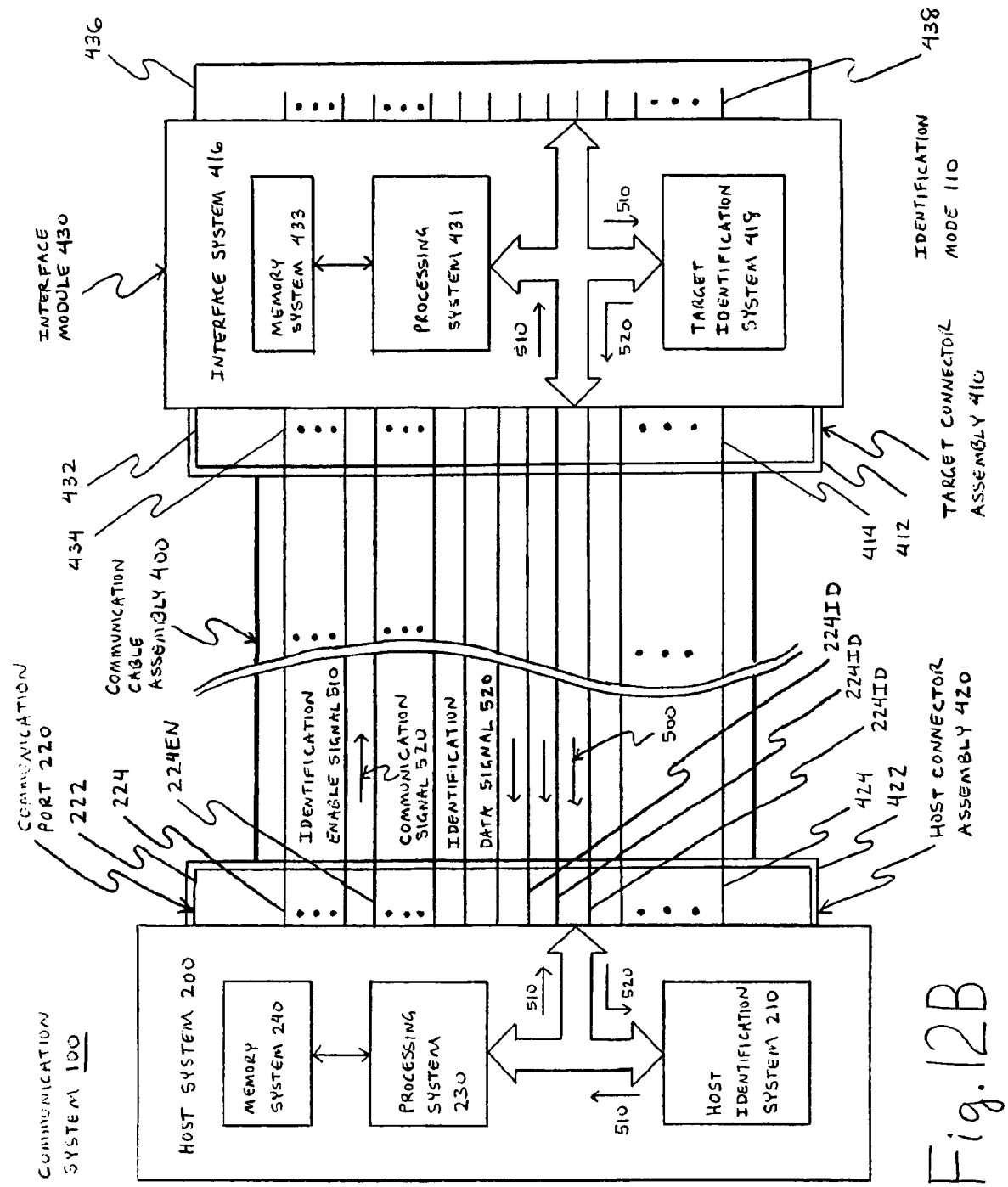
FIG. 12B is a detail drawing illustrating another alternate embodiment of the identification system of FIG. 2 in which the identification system is at least partially incorporated into an interface module having a processing system and a memory system.

As desired, the interface system 416 can be configured to removably couple with the communication cable assembly 400. The interface system 416, for example, can be disposed within an interface module 430 as illustrated in FIG. 12B. Being separate from the communication cable assembly 400, the interface module 430 can include a first connector assembly 432 for coupling with the target connector assembly 410 of the communication cable assembly 400 and a second connector assembly 436 for coupling with the communication port 310 (shown in FIGS. 7A-B) of the target system 300 (shown in FIGS. 7A-B). The connector assemblies 432, 436 can include any appropriate number of contacts, pins, or terminals 434, 438 and can be coupled with, and configured to communicate with, the interface system 416 and, therefore, the target identification system 418. The first connector assembly 432 can couple with the connector assembly 412 of the target connector assembly 410; whereas, the second connector assembly 436 can be configured to couple with the connector assembly 312 of the communication port 310. The second connector assembly 436 can couple with the connector assembly 312 of the communication port 310 in any conventional manner, including directly and/or indirectly, for example, via a second communication cable assembly (not shown) such as the communication cable assembly 400AB (shown in FIG. 15A).

Being provided in the manner set forth above with reference to the target system 300 (shown in FIG. 2), the interface module 430 can include a processing system 431 and/or a memory system 433 as shown in FIG. 12B. The processing system 431 of the interface module 430 can be provided in the manner discussed above with reference to processing system 330 (shown in FIG. 2) of the target system 300; whereas, the memory system 433 can be provided in the manner set forth above regarding the memory system 340 (shown in FIG. 2). As discussed above, the processing system 431 can be configured to receive communication signals 500 provided, for example, by the host system 300 and to perform one or more functions, as desired, on the communication signals 500, providing the result of the functions to the memory system 433 and/or the host system 200. Being coupled with the processing system 431, the memory system 433 can provide data storage for the interface module 430. As discussed above with regard to the memory system 340, the memory system 433 can store and provide any conventional type of information, including information, such as instruction code and/or intermediate calculation results, associated with the processing system 431 and/or information associated with the communication signals 500.

Thereby, the interface systems 416 of FIGS. 12A-B and, therefore, the target identification systems 418 can exchange one or more communication signals 500 with the host system 200 and/or the target system 300. The communication system 100 therefore can operate as a conventional communication system in the operation mode 120, exchanging one or more operation signals 530 between the host system 200 and the target system 300 as shown in FIG. 13. In the manner set forth above with reference to FIG. 2, the target identification system 418 preferably has a negligible effect on the operation and/or performance of the communication system 100 in the operation mode 120.

When the communication system 100 is in the identification mode 110, the target identification system 418 can be configured to receive the identification request signal 510 from the host identification system 210 and can provide the identification data signal 520 to the host identification system 210 as discussed above with regard to FIG. 7A. As discussed above, the identification data signal 520 provided by the target identification system 418 can include information. Since the target identification system 418 can be associated with the target system 300, for example, the identification data signal 520 can include information regarding the target system characteristics of the target system 300. The target identification system 418 preferably can provide the information regarding the target system characteristics of the target system 300 in the manner set forth in more detail above with reference to FIGS. 7A, 8, and 9A-C. The host system 220 can receive the information regarding the target system characteristics and, as discussed above, attempt to identify the target system 300. Preferably being reconfigurable, the host system 200 likewise can be at least partially reconfigured, as necessary, to become compatible with the target system 300.

In the manner set forth in more detail above with reference to the identification data signal 520 provided by the target system 300, the target identification system 418 likewise can provide the identification data signal 520 that includes information regarding one or more interface system characteristics of the interface system 416. Stated somewhat differently, the interface system 416 can comprise a target system of the communication system 100 in the manner discussed above with regard to the target system 300 (shown in FIG. 7A-B). In the manner discussed above, the information provided by the identification data signal 520 can comprise any suitable number and/or type of interface system characteristics that may be used for identifying the interface system 416 and can be fixed and/or adjustable, as desired. The host system 200 therefore can receive information regarding the interface system characteristics and, as discussed above, attempt to identify the interface system 416 based at least in part upon the interface system characteristics and, as necessary, at least partially reconfigure itself such that the host system 200 can become compatible with the interface system 416.

For example, the target identification system 418 can provide the identification data signal 520 that includes information regarding one or more module characteristics of the interface module 430. Any suitable type of characteristic can comprise a module characteristic as desired. Since the interface module 430 is illustrated in FIG. 12B as being provided in the manner set forth above with reference to the target system 300, the module characteristics of the interface module 430 likewise can be provided as discussed above regarding the target system characteristics of the target system 300. The module characteristics, for instance, can include one or more general characteristics, such as a system type, a system model, and/or a system serial number, of the interface module 430. One or more operational characteristics, such as a hardware version, a software version, and/or an operational status, and/or one or more external characteristics, such as a physical location of the interface module 430 likewise can be provided as a module characteristic.

The target identification system 418 likewise can be configured to include information with the identification data signal 520 with regard to one or more cable assembly characteristics of the communication cable assembly 400. For example, the cable assembly characteristics can include one or more general characteristics, such as a cable assembly type, a cable assembly model, and/or a cable assembly length, of the communication cable assembly 400. One or more operational characteristics, such as a cable assembly version, a connector assembly type of the first connector assembly 432, a connector assembly type of the second connector assembly 436, and/or whether the communication cable 430 includes one or more sets of twisted conductors 440, likewise can be provided as cable assembly characteristics.

As desired, information regarding one or more interface system characteristics of the interface system 416 and/or the target identification system 418 can be included with the identification data signal 520. In the manner set forth above with regard to the target system characteristics, the interface system characteristics can include one or more general characteristics, such as an interface type, an interface model, and/or an interface number, of the interface system 416. One or more operational characteristics of the interface system 416, such as a hardware version, a software version, and/or an operational status, and/or one or more external characteristics, such as a connector assembly type of the connector assembly 412, likewise can be provided as interface system characteristics.

Figure 14F:
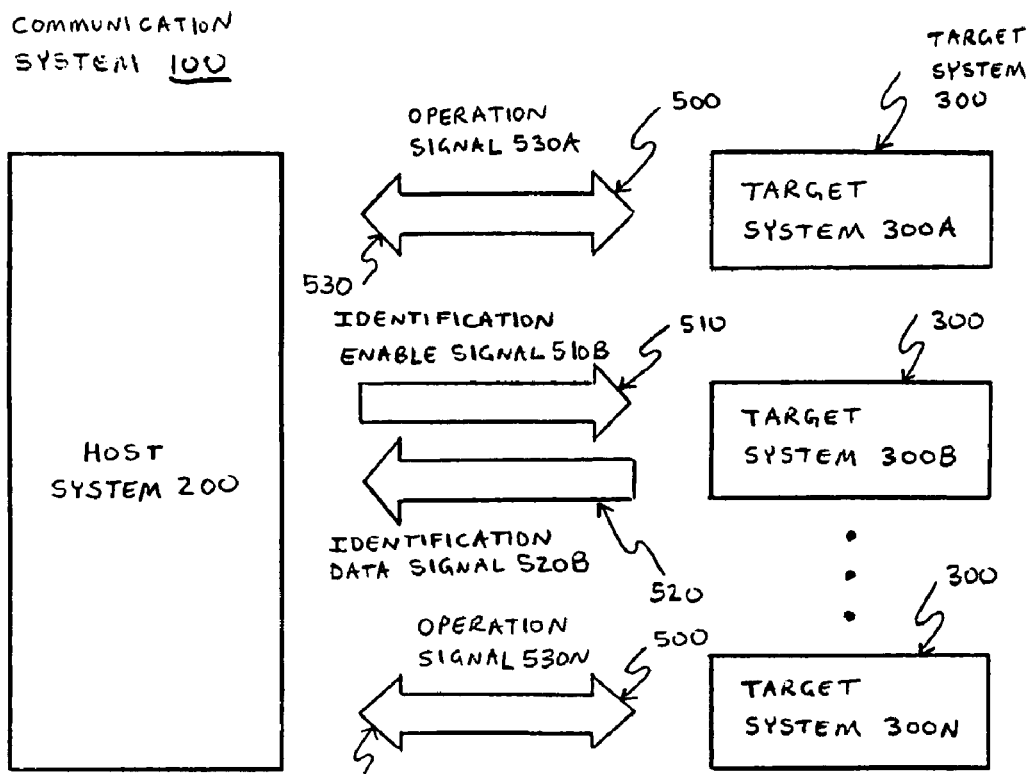
FIG. 14F is an exemplary top-level block diagram illustrating the communication system of FIG. 14E once a selected target system has been identified.

Turning to FIGS. 14A-F, an exemplary communication system 100 is illustrated that comprises a host system 200 and a plurality of target systems 300. The host system 200 can be provided as set forth in more detail above with regard to the host system 200 (shown in FIGS. 1A-B and 2); whereas, each of the target systems 300 can be provided in the manner discussed above with regard to the target system 300 (shown in FIGS. 1A-B and 2). As desired, the communication system 100 can have any suitable number of target systems 300, which may include target systems 300 that are uniform and/or different. In the manner discussed above with reference to FIGS. 1A-B, the host system 200 is configured to couple with, and communicate with, the target systems 300, and, as shown in FIG. 14A, the communication system 100 is configured such that a communication signal 500 can be exchanged between the host system 200 and each target system 300. Although shown and described with reference to FIGS. 14A-F as comprising one host system 200 for purposes of illustration, the communication system 100 can include any suitable number of host systems 100, as desired, with each host system 200 being configured to couple with, and communicate with, the one or more of the target systems 300.

Figure 14C:
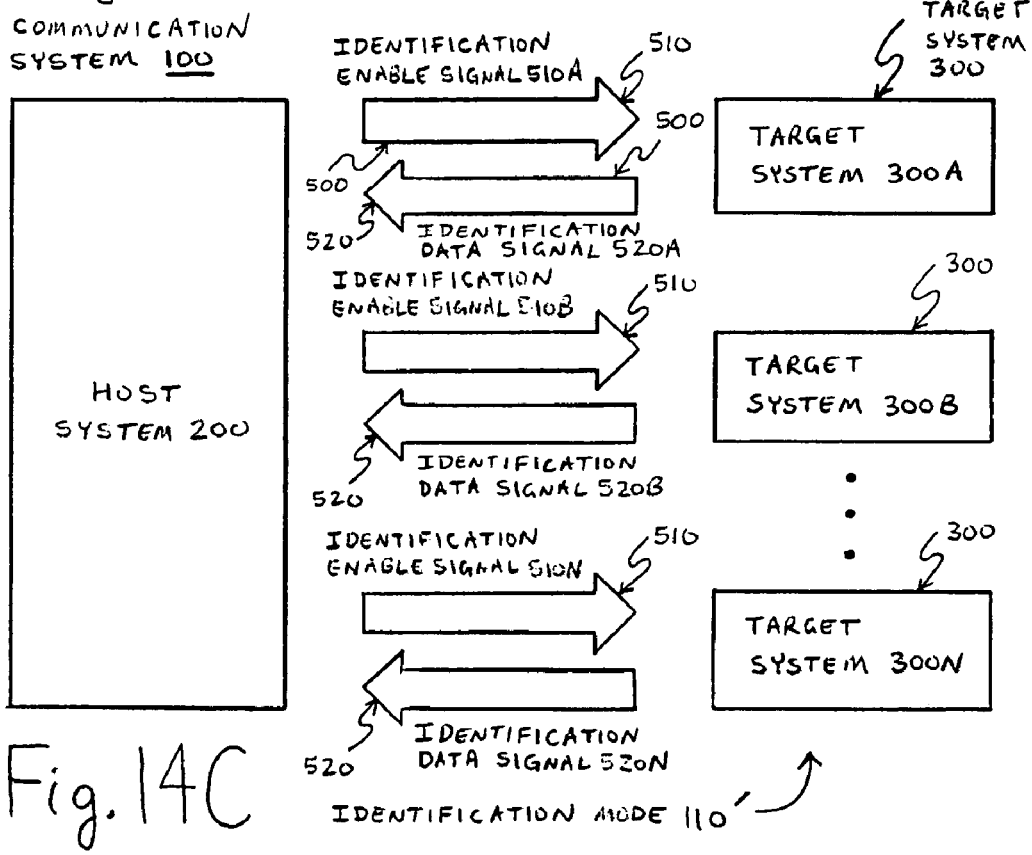
FIG. 14C is an exemplary top-level block diagram illustrating an alternative embodiment of the communication system of FIG. 14B in which the communication system in the identification mode is configured to identify two or more target systems in parallel.
Figure 14D:
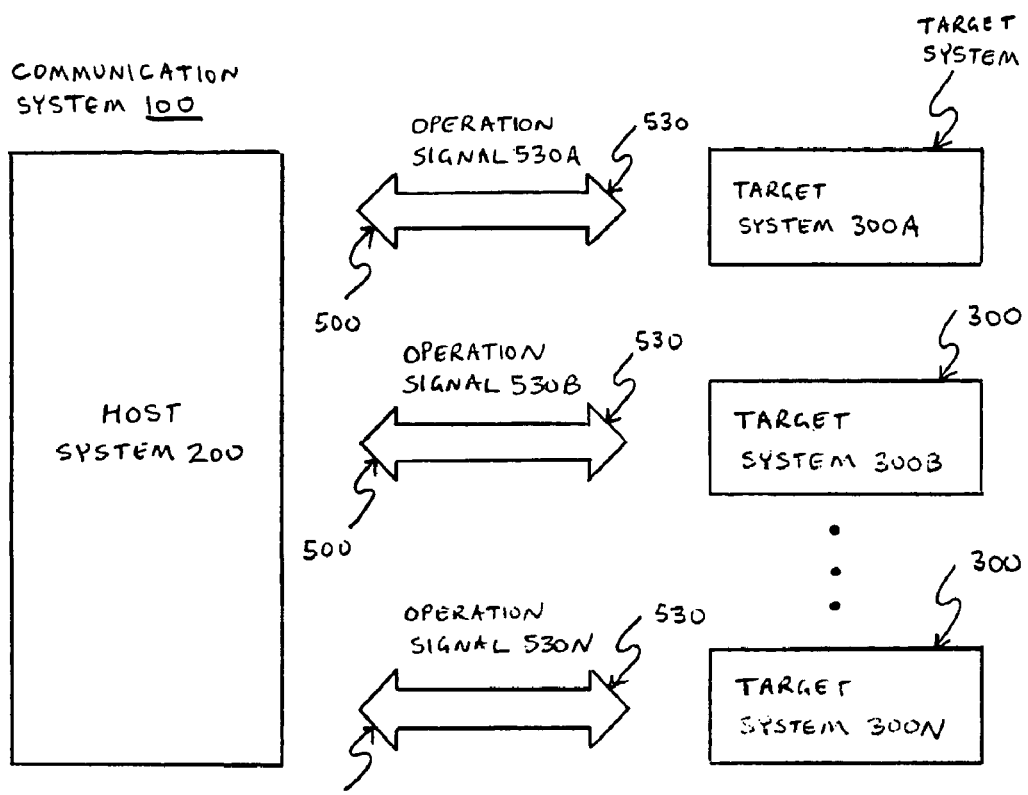
FIG. 14D is an exemplary top-level block diagram illustrating the communication system of FIG. 14A upon entering an operation mode.

The communication system 100 can have a target system identification mode 110 as shown in FIG. 14B and a target system operation mode 120 as illustrated in FIG. 14D. As desired, the communication system 100 can initiate the identification mode 110 of FIG. 14B, preferably via the host system 200. In the identification mode 110, the communication system 100 is illustrated as being configured to identify one or more of the plurality of target systems 300. The communication system 100 can attempt to identify the target systems 300 in any suitable manner, such as in the manner discussed above with reference to FIG. 1A. Thereby, the communication system can be configured to exchange at least one communication signal 500, such as one or more identification signals 510, 520, between the host system 200 and each target system 300.

When the communication system 100 is in the identification mode 110, the host system 200 can select a target system 300, such as target system 300B as shown in FIG. 14B, and can provide an identification request signal 510B to the selected target system 300B. Upon receiving the identification request signal 510B, the target system 300B preferably is configured to respond by providing an identification data signal 520B. The host system 200 can receive the identification data signal 520B and, thereby, can attempt to identify the selected target system 300B. In the manner set forth above, the identification data signal 520B preferably includes information regarding one or more target system characteristics associated with the target system 300. The host system 200 can attempt to identify the target system 300 based, in whole and/or in part, upon the target system characteristics as discussed above.

The host system 200 can attempt to identify the target systems 300 in accordance with any suitably predetermined criteria. For example, the host system 200 can be configured to identify one target system 300 at a time in accordance with a selected sequence. Therefore, upon identifying the selected target system 300B, the host system 200 of FIG. 14B can select another target system 300, such as target system 300A or target system 300N, and can attempt to identify the selected target system 300. The host system 200 preferably can continue to select and to attempt to identify the target systems 300 in accordance with the selected sequence until the host system 200 has attempted to identify each of the target systems 300.

As desired, the host system 200 can be configured to attempt to identify two or more target systems 300 at a time when the communication system is in an identification mode 110' as illustrated in FIG. 14C. By providing a plurality of identification request signals 510A-N, the host system 200 of FIG. 14C is shown as attempting to identify a plurality of selected target systems 300A-N. The respective target systems 300A-N can receive the identification request signals 510A-N and can respond by providing identification data signals 520A-N. The host system 200 can receive the identification data signals 520A-N and, thereby, can attempt to identify each of the selected target system 300A-N, preferably based at least in part upon the information regarding the target system characteristics included with each identification data signals 520A-N. As discussed above, the host system 200 can continue to select and to attempt to identify the target systems 300 until the host system 200 has attempted to identify each target system 300.

Once the host system 200 has attempted to identify the target systems 300, the communication system 100 can enter the operation mode 120 as shown in FIG. 14D. The communication system 100 preferably can at least partially reconfigure the host system 200, as necessary, in anticipation of entering the operation mode 120. Therefore, when the communication system 100 enters the operation mode 120 as shown in FIG. 14D, the host system 200 is compatible with, and configured to communicate with, the identified target systems 300. The host system 200 thereby can be configured to exchange communication signals 500A-N, such as operation signals 530A-N, with the target systems 300A-N. In the manner set forth above with reference to FIGS. 1A-B, the communication system 100 can be configured to identify one or more host systems 200 and/or to at least partially reconfigure, as necessary, one or more of the target systems 300 to be compatible with the host system 200. The communication system 100 thereby can be configured to operate as a conventional communication system upon entering the operation mode 120.

Figure 14E:
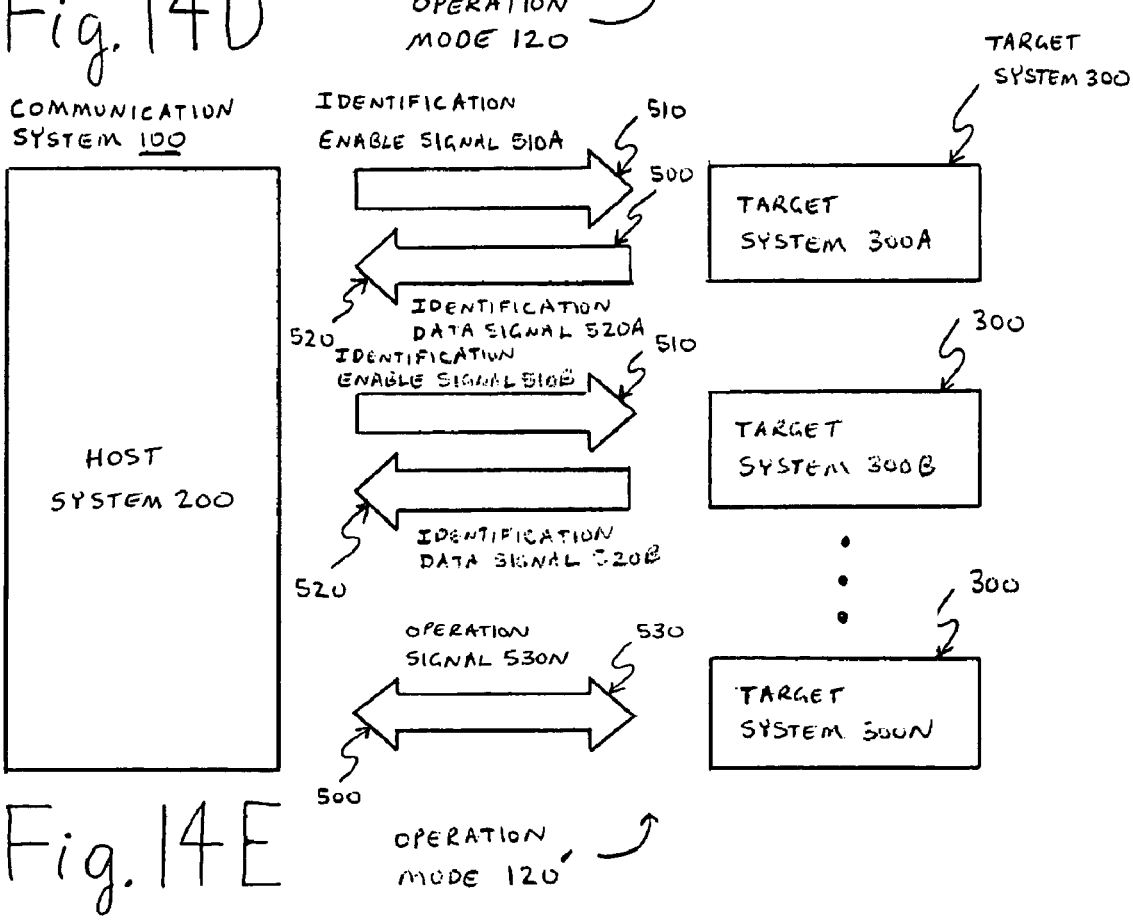
FIG. 14E is an exemplary top-level block diagram illustrating an alternative embodiment of the communication system of FIG. 14D in which each target system can be configured to independently enter the operation mode upon being identified.

The communication system 100 can be configured to transition from the identification mode 110, 110' to the operation mode 120 in any suitable manner. For example, the communication system 100 can enter the operation mode 120 after the host system 200 has attempted to identify each target system 300. The transition to the operation mode 120 likewise can be more gradual with the communication system 100 entering at least one partial operation mode 120, such as partial operation modes 120', 120" as shown in FIGS. 14E-F. In the partial operation mode 120', the host system 200 is configured to exchange the operation signal 530N with the identified target system 300N while attempting to identify the selected target systems 300A, 300B. Upon identifying the target system 300A, the host system 200 can exchange operation signals 530A, 530N with the identified target systems 300A, 300N and continue to identify selected target systems 300A, 300B as illustrated in FIG. 14F. The communication system 100 preferably enters the operation mode of FIG. 14D after attempting to identify each of the target systems 300. As desired, the host system 200 likewise can be reconfigured as each target system 300 is identified and/or upon attempting to identify all of the target systems 300.

The target systems 300 can be coupled with the host system 200 in any suitable configuration and/or arrangement. For example, at least a portion of the target systems 300 can be provided in a serial arrangement as illustrated in FIG. 15A and/or in a parallel arrangement as shown in FIG. 15B. Turning to FIG. 15A, for example, the communication system 100 is shown as comprising a host system 200 and target systems 300A, 300B. Being provided in the manner set forth in more detail above with reference to FIG. 2, the host system 200 is illustrated as including a communication port 220 for coupling the host system 200 with one or more of the target systems 300A, 300B and being associated with a host identification system 210. When the communication system 100 is in an identification mode 110 as illustrated in FIG. 15A, the host system 200 thereby is configured to provide an identification request signal 510 to one or more of the target systems 300A, 300B and to receive an identification data signal 520 from at least one of the target systems 300A, 300B in the manner set forth above.

Figure 17A:
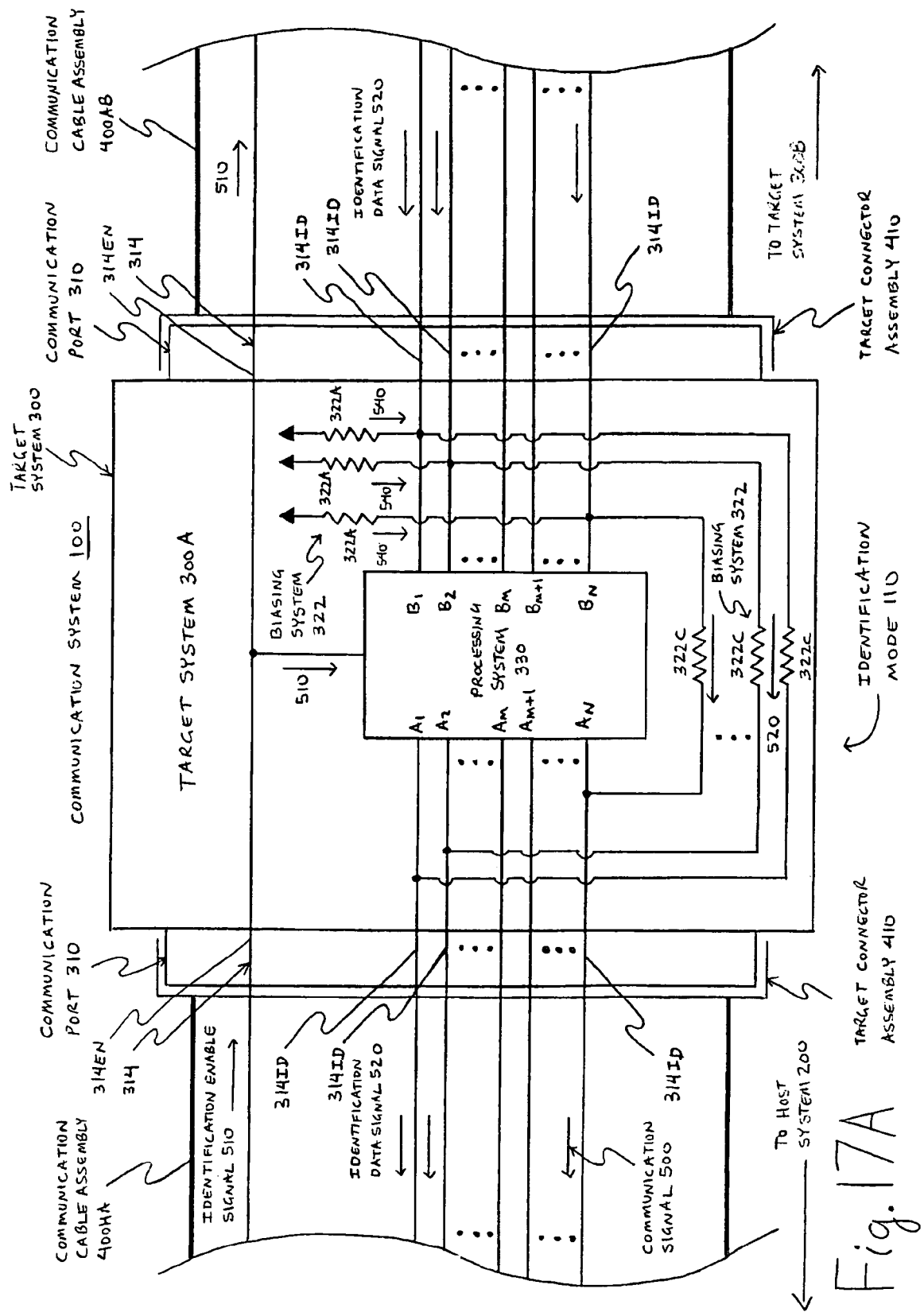
FIG. 17A is a detail drawing illustrating an embodiment of the identification system of FIGS. 16A-B in which the identification system includes a biasing system for providing a biasing signal that includes information regarding one or more target system characteristics associated with the target system.
Figure 17B:
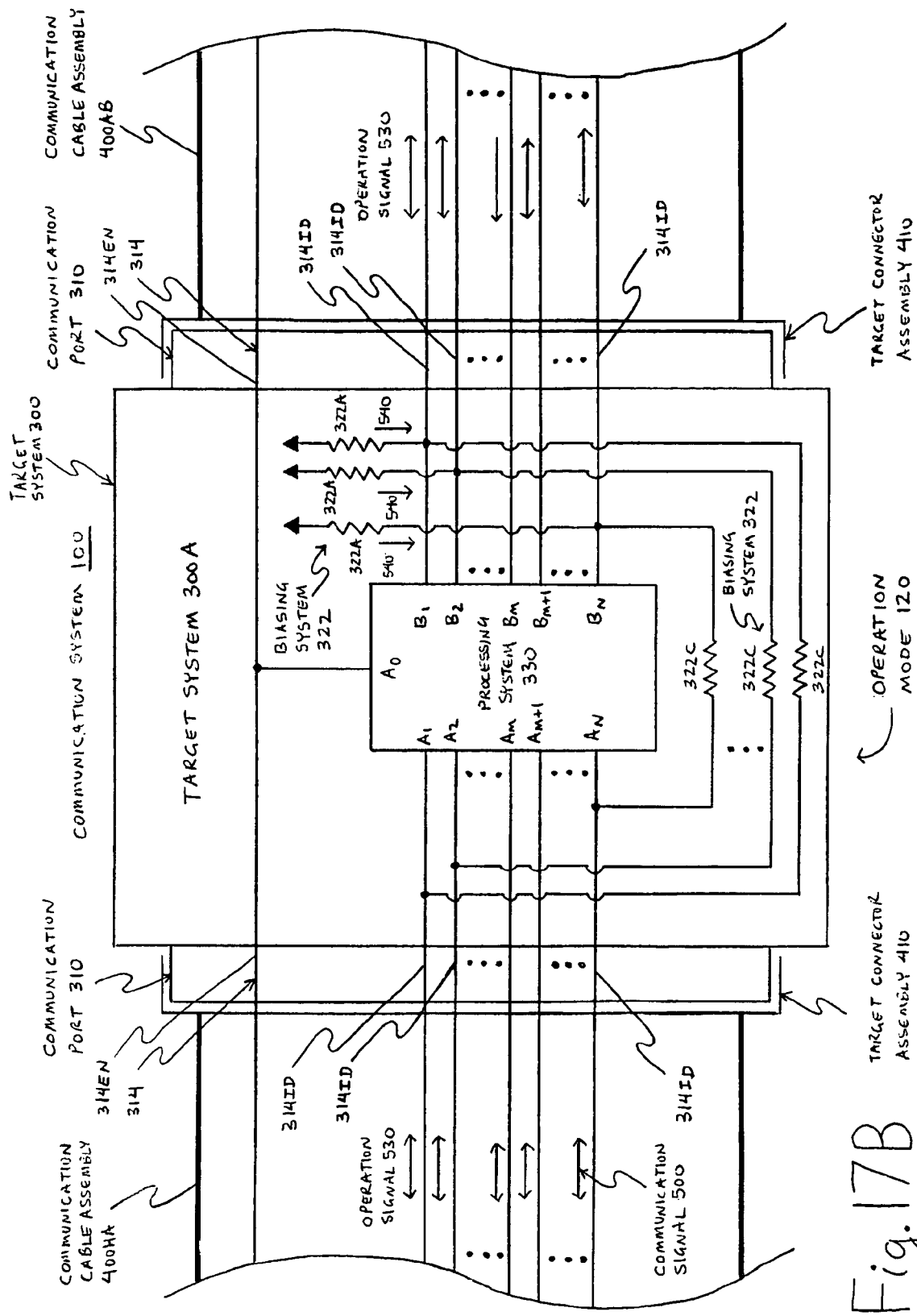
FIG. 17B is a detail drawing illustrating the biasing system of FIG. 17A when the communication system is in an operation mode.

Similarly, the target systems 300A, 300B can be provided in the manner discussed above with regard to the target system 300 of FIG. 2. Each target system 300A, 300B can have at least one communication port 310 and can be respectively associated with a target identification system 320A, 320B. As shown in FIG. 15A, the target system 300A has a host communication port 310 for coupling with the host system 200 and a target communication port 310 for coupling with the target system 300B. The target system 300B likewise is shown as including a communication port 310 for coupling with the target system 300A. Communication signals 500 can be exchanged between the first second communication ports 310 of the target system 300A in any suitable manner. As shown in FIGS. 17A-B, one or more terminals 314 of the communication ports 310 can be directly coupled in the manner illustrated by exemplary terminals 314EN; whereas, one or more other terminals 314 of the communication ports 310 can be indirectly coupled via, for example, a signal processing system 350.

The host system 200 and the target systems 300A, 300B can be coupled, and configured to communicate, in any conventional manner, including directly and/or indirectly. As shown in FIG. 15A, the host system 200 and the target systems 300A, 300B are coupled via communication cable assemblies 400HA, 400AB such that the communication signals 500 can be exchanged among the host system 200 and the target systems 300A, 300B. Being provided in the manner discussed in more detail above with reference to the communication cable assembly 400 of FIG. 2, the communication cable assembly 400HA is shown as including a target connector assembly 410 that is coupled with a host connector assembly 420 and is configured to couple the communication port 220 of the host system 200 and the host communication port 310 of the target system 300A. Similarly, the communication cable assembly 400AB can be provided in the manner set forth above and can have coupled target connector assemblies 410 for coupling the target communication port 310 of the target system 300A and the communication port 310 of the target system 300B.

Thereby, when the communication system 100 is properly assembled, the communication signals 500 can be exchanged among the communication port 220 of the host system 200 and the communication ports 310 of the target systems 300A, 300B via the communication cable assemblies 400HA, 400AB as discussed above. The target system 300A in the identification mode 110 can receive the identification request signal 510 from the host system 200 and can be configured to provide the identification request signal 510, in whole and/or in relevant part, to the target system 300B. In response, the target systems 300A, 300B can provide the identification data signal 520 to the host system 200. The target systems 300A, 300B each can provide the identification data signal 520, in whole and/or in part. Although shown and described with reference to FIG. 15A as including two target systems 300A, 300B for purposes of illustration, the communication system 100 can include any suitable number of target systems 300.

Figure 16A:
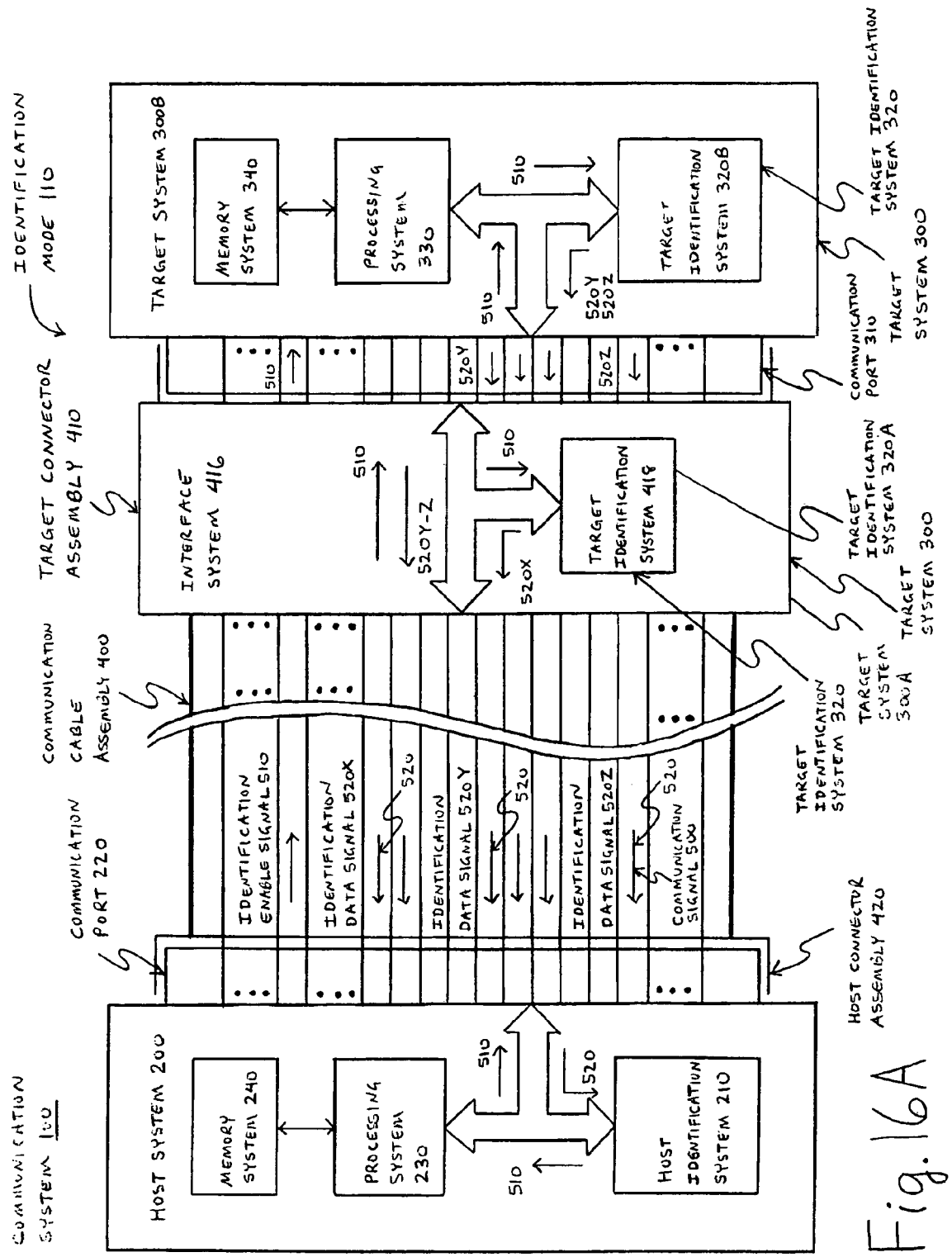
FIG. 16A is a detail drawing illustrating an embodiment of the communication system of FIG. 15A in which the identification system is configured to provide a common identification enable signal to the plurality of target systems.

The communication system 100 can attempt to identify the target systems 300 in any suitable manner. Since the use of a single terminal 224EN is preferred as set forth above with reference to FIGS. 7A-B, the communication system 100 preferably is configured to attempt to identify the target systems 300 via a composite identification enable signal 510 as illustrated in FIG. 16A. The target system 300A is shown as being associated with the communication cable assembly 400. Being provided in the manner discussed in more detail above with reference to FIG. 12A, the target system 300A is at least partially disposed in the target connector assembly 410 of the communication cable assembly 400 and can include the interface system 416 having the target identification system 418. The interface system 416 thereby can be configured to provide at least a portion of the identification data signal 520, such as identification data signal 520X as shown in FIG. 16A, in response to the identification enable signal 510. The identification data signal 520X can be provided in the manner set forth above, including the hierarchical manner discussed with reference to FIGS. 9A-C, and preferably includes information with regard to one or more cable assembly characteristics of the communication cable assembly 400 in the manner discussed above.

The target system 300B likewise is illustrated as being coupled with the target connector assembly 410 of the communication cable assembly 400 and as being configured to communicate with the host system 200 via the communication cable assembly 400. Being provided in the manner set forth above with reference to the target system 300 (shown in FIG. 2), the target system 300B can be associated with the target identification system 320B. As discussed above, the target system 300B can be configured to respond to the identification enable signal 510 by providing at least a portion of the identification data signal 520, such as hierarchical identification data signals 520Y, 520Z, which include information with regard to one or more target system characteristics associated with the target system 300B. The identification data signals 520Y, 520Z can be communicated from the target system 300B to the host system 200 via the interface system 416.

As set forth above, the host system 200 can be configured to assert the identification request signal 510 in accordance with predetermined criteria. The communication system 100 then can enter and/or maintain the identification mode 110, and the host system 200 can initiate identification of the target systems 300A, 300B. The interface system 416 can receive the identification request signal 510 and can provide the identification request signal 510 to the target identification system 418 of the interface system 416 and to the target identification system 320B of the target system 300B. Stated somewhat differently, the identification request signal 510 can be communicated from the host system 200 to the target system 300B via the interface system 416. As discussed above, the target identification system 418 can respond to the identification request signal 510 by providing the identification data signal 520X; whereas, the target identification system 320B can respond to the identification request signal 510 by providing the identification data signals 520Y, 520Z.

The target identification systems 418, 320B are configured to provide the identification data signals 520X, 520Y, 520Z to the host system 200 as the composite identification data signal 520 as shown in FIG. 16A. Upon receiving the identification data signal 520, the host system 200 is configured to attempt to identify the communication cable assembly 400 and the target system 300B in the manner discussed in more detail above based at least in part upon the information regarding the cable assembly characteristics and/or the target system characteristics included with the identification data signal 520. Upon identifying the communication cable assembly 400 and the target system 300B, the host system 200 likewise can be at least partially reconfigured, as necessary, such that the host system 200 can be compatible with the communication cable assembly 400 and the target system 300B as discussed above. The communication system 100 thereby is configured to operate as a conventional communication system in the operation mode 120 (shown in FIG. 7B), exchanging communication signals 500, such as an operation signal 530 (shown in FIG. 7B), among the host system 200, the communication cable assembly 400, and the target system 300B in the manner set forth above.

Figure 16B:
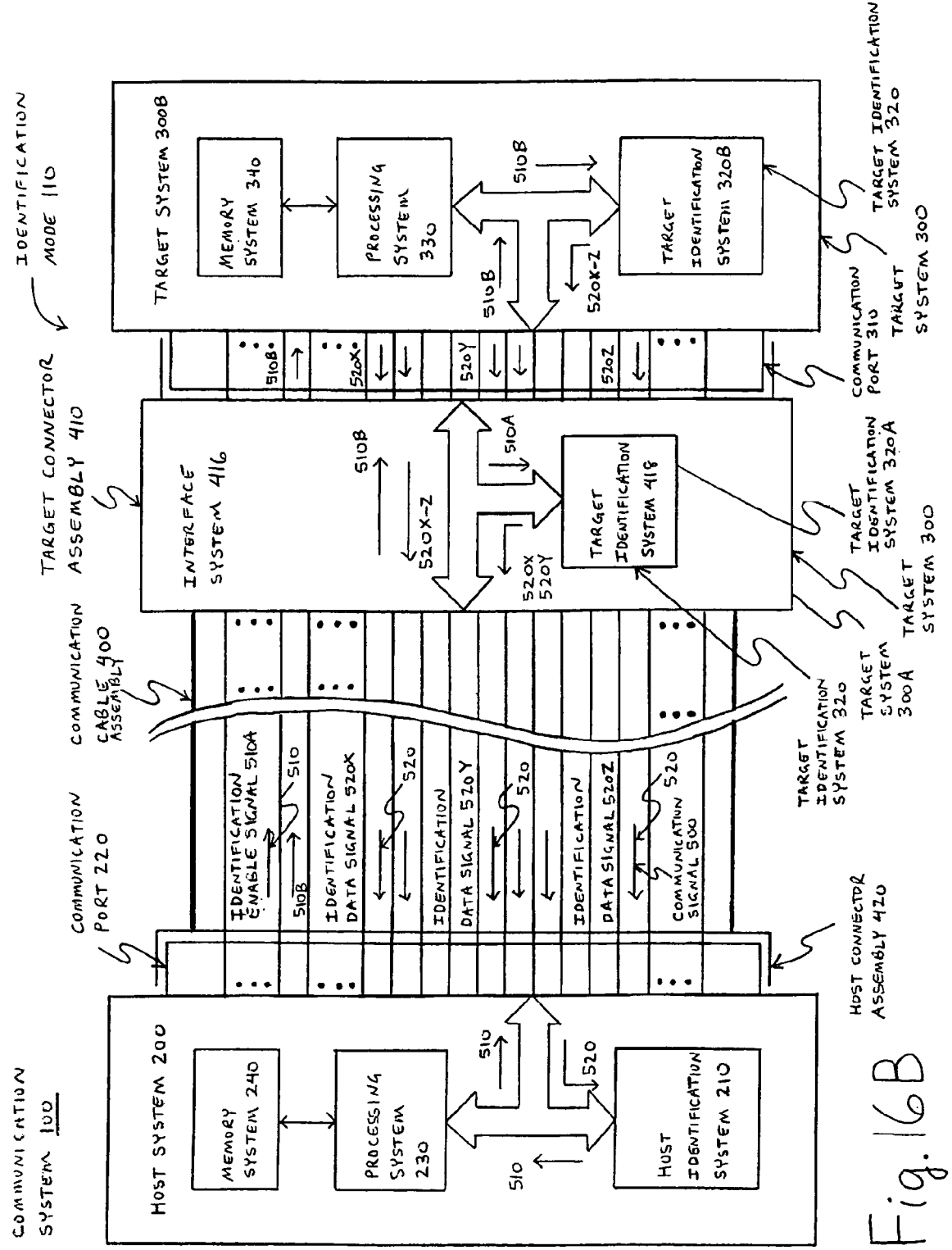
FIG. 16B is a detail drawing illustrating an alternative embodiment of the communication system of FIG. 15A in which the identification system is configured to provide a separate identification enable signal for each target system.

Any suitable number of identification enable signals 510 likewise can be used by the communication system 100 to identify the target systems 300A, 300B. The identification enable signals 510 can include one or more composite identification enable signals 510 and/or separate identification enable signals 510. Turning to FIG. 16B, for example, the host system 200 is illustrated as being configured to provide identification enable signal 510A to the target system 300A and identification enable signal 510B to the target system 300B. The identification enable signal 510A and the identification enable signal 510B can comprise separate signals as desired. Being provided in the manner discussed above with reference to FIG. 16A, the target system 300A can include the target identification system 418 for receiving the identification enable signal 510A and for providing the hierarchical identification data signals 520X, 520Y. Similarly, the target system 300B is provided in the manner set forth above. The target system 300B is shown as including the target identification system 320B and as being configured to receive the identification enable signal 510B and to provide the hierarchical identification data signals 520X, 520Y, 520Z as discussed above. The identification enable signal 510B and the identification data signals 520X, 520Y, 520Z can be exchanged between the host system 200 and the target system 300B via the interface system 416.

By asserting the identification request signals 510A, 510B, the host system 200 can initiate identification of the target systems 300A, 300B, and the communication system 100 can enter and/or maintain the identification mode 110. The host system 200 can assert the identification request signals 510A, 510B in any suitable manner to initiate identification of the target systems 300A, 300B. The host system 200 preferably is configured to assert the identification request signals 510A, 510B individually in accordance with a preselected sequence. Thereby, the host system 200 can initiate identification of the interface system 416 by asserting the identification request signal 510A; whereas, the identification of the target system 300B can be initiated when the identification request signal 510B is asserted. The host system 200 likewise can cooperatively assert the identification request signals 510A, 510B. For example, the communication system 100 can enter and/or maintain the identification mode 100 when the identification request signal 510A is asserted, and, while continuing to assert the identification request signal 510A, the host system 200 likewise can assert the identification request signal 510B to select the target system 300A, 300B to be identified.

If configured to individually assert the identification request signals 510A, 510B as set forth above, the host system 200 can provide the identification request signals 510A, 510B in accordance with the preselected sequence. When the host system 200 provides the identification request signal 510A, the identification request signal 510A can be received by the target identification system 418 of the interface system 416 as discussed above. The target identification system 418 can respond to the identification request signal 510A by providing the identification data signals 520X, 520Y to the host system 200. The host system 200 likewise can provide the identification request signal 510B to the target identification system 320B of the target system 300B via the interface system 416. Upon receiving the identification request signal 510B, the target identification system 320B can respond by providing the identification data signals 520X, 520Y, 520Z to the host system 200 via the interface system 416. As illustrated by FIG. 16B, the identification data signal 520 provided by the interface system 416 and the identification data signal 520 provided by the target system 300B can be uniform and/or different.

In the manner set forth above, the host system 200 can attempt to identify the communication cable assembly 400 upon receiving the identification data signals 520X, 520Y from the target identification system 418 and can attempt to identify the target system 300B upon receiving the identification data signals 520X, 520Y, 520Z from the target identification system 320B. Upon identifying the communication cable assembly 400 and the target system 300B, the host system 200 likewise can be at least partially reconfigured, as necessary, such that the host system 200 can be compatible with the communication cable assembly 400 and the target system 300B as discussed above. The communication system 100 thereby is configured to operate as a conventional communication system in the operation mode 120 (shown in FIG. 7B), exchanging communication signals 500, such as an operation signal 530 (shown in FIG. 7B), among the host system 200, the communication cable assembly 400, and the target system 300B in the manner set forth above.

In the manner discussed above with reference to FIGS. 15A-B and 16A-B, the target system 300A preferably can facilitate exchanges of the communication signals 500 between the host system 200 and the target system 300B. The target system 300A illustrated in FIGS. 17A-B is configured to facilitate such communication signal 500 exchanges while having a negligible effect on the operation and/or performance of the communication system 100. Turning to FIGS. 17A-B, the target system 300A can be provided in the manner set forth in more detail above with reference to FIG. 2 and has a host communication port 310 for coupling with the host system 200 and a target communication port 310 for coupling with the target system 300B as set forth in more detail above with reference to FIG. 15A. The communication ports 310 can be coupled with, and configured to communicate with, a processing system 330 and/or a memory system 340 (shown in FIGS. 7A-B). Stated somewhat differently, the communication ports 310 can be coupled, and configured to communicate, via the processing system 330 and/or the memory system 340. The host communication port 310 is illustrated as being coupled with terminals $A_0$-$A_N$ of the processing system 330; whereas, the target communication port 310 is illustrated as being coupled with terminals $B_1$-$B_N$ of the processing system 330.

The target system 300 likewise can include a biasing system 322 for providing a biasing signal 540 in the manner discussed in more detail above with reference to FIG. 10. The biasing system 322 can be provided in any conventional manner and preferably comprises a passive biasing system. If provided as a resistive biasing system, for example, the biasing system 322 can include a suitable arrangement and/or configuration of one or more resistive elements 322A, 322C as illustrated in FIGS. 17A-B. The resistive elements 322A, 322C can be provided in the manner set forth above with reference to the resistive elements 322A, 322B (shown in FIG. 11A-B) and can have impedances that can be maintained within one or more selected ranges of impedances. Preferably, the impedance of each resistive element 322A, 322C remains within a preselected range, such as one of the ranges, including the five kilohm (5 kΩ) ranges, set forth in more detail above with reference to FIGS. 11A-B.

The resistive elements 322A, 322C can be configured to facilitate the exchange of communication signals 500 between the host system 200 and the target system 300B via the target system 300A. As shown in FIGS. 17A-B, the resistive elements 322A can be configured as pull-up resistive elements, and the resistive elements 322C are illustrated as being bypass resistive elements. In the manner discussed above with reference to FIGS. 11A-B, the resistive elements 322A can be coupled with any conventional type of reference source, and the output level of the reference sources associated with the resistive elements 322A can be uniform and/or differ. The resistive elements 322A likewise are shown as being coupled with the terminals 314ID of the target communication port 310. The terminals 314ID of the target communication port 310 thereby can be biased to a predetermined voltage level in the manner discussed above with reference to FIGS. 11A-B.

The resistive elements 322C are illustrated as coupling the terminals 314ID of the target communication port 310 with corresponding terminals 314ID of the host communication port 310. Being configured to operate as bypass resistive elements, the resistive elements 322C preferably have impedances that are selected to facilitate exchanges of the communication signals 500, as desired, between the target communication port 310 and the host communication port 310 of the target system 300A. The resistive elements 322C thereby can be configured to at least partially bypass the processing system 330. The communication signals 500 therefore can be exchanged between the target communication port 310 and the host communication port 310 of the target system 300A directly, indirectly via the processing system 330 and/or indirectly via the resistive elements 322C, as desired. Preferably, the resistive elements 322C are configured to selectably bypass the processing system 330.

In the identification mode 110, the host system 200 of FIG. 17A can provide the identification request signal 510 to the relevant terminal 314EN of the host communication port 310 of the target system 300A. Within the target system 300A, the identification request signal 510 is shown as being distributed to the processing system 330 and the relevant terminal 314EN of the target communication port 310. Being configured to at least partially control the operation of the processing system 330 in the conventional manner, the identification request signal 510 preferably is configured to disable the processing system 330 in the identification mode 110. The terminals $A_0$-$A_N$ and the terminals $B_0$-$B_N$ thereby are inhibited from exchanging the communication signal 500 and preferably are configured to enter a high-impedance state. Therefore, the terminals 314ID of the host communication port 310 and the terminals 314ID of the target communication port 310 are coupled via the bypass resistive elements 322C.

The terminals 314ID of the target communication port 310 likewise are biased to a high logic level by the resistive elements 322A. Therefore, when the target system 300B provides a selected identification data signal 520 with the high logic level (or is associated with an open circuit), the relevant terminal 314ID of the target communication port 310 is associated with the high logic level. The selected identification data signal 520 with the high logic level can be communicated to the relevant terminal 314ID of the host communication port 310 via the relevant bypass resistive element 322C as shown in FIG. 17A. The host communication port 310 can provide the selected identification data signal 520 with the high logic level to the host system in the manner set forth above.

Similarly, when the selected identification data signal 520 is associated with a low logic level, the relevant terminal 314ID of the target communication port 310, even though biased to the high logic level, is driven to the low logic level. In the manner set forth above, the selected identification data signal 520 with the low logic level can be communicated to the relevant terminal 314ID of the host communication port 310 via the relevant bypass resistive element 322C. The host communication port 310 can provide the selected identification data signal 520 with the low logic level to the host system as discussed above. Thereby, the identification data signal 520 can be provided from the target system 300B to the host system 200 via the target system 300A. The host system 200 can attempt to identify the target system 300B upon receiving the identification data signal 520 in the manner set forth above. Upon identifying the target system 300B, the host system 200 likewise can be at least partially reconfigured, as necessary, such that the host system 200 can be compatible with the target system 300B as discussed above.

In the operation mode 120, the processing system 330 can be enabled as shown in FIG. 11B. When the processing system 330 is enabled, the communication signals 500 can be exchanged between the target communication port 310 and the host communication port 310 of the target system 300A via the enabled processing system 330. The target system 300A therefore is configured to permit the operation signal 530 to be exchanged between the target system 300B and the host system 200 in the manner set forth above with reference to FIG. 7B. As discussed above, the resistive elements 322A, 322B preferably have a negligible effect on the operation and/or performance of the communication system 100 in the operation mode 120, and the operation signal 530 can be exchanged among the host system 200 and the target systems 300A, 300B in a conventional manner.

FIG. 15B illustrates a communication system 100 that comprises a host system 200 and a parallel arrangement of target systems 300A, 300B. Being provided in the manner set forth in more detail above with reference to FIG. 2, the host system 200 is illustrated as including a communication port 220 for coupling the host system 200 with the target systems 300A, 300B and being associated with a host identification system 210. Similarly, the target systems 300A, 300B can be provided in the manner discussed above with regard to the target system 300 of FIG. 2. Each target system 300A, 300B can have at least one communication port 310 for coupling with the host system 200 and can be respectively associated with a target identification system 320A, 320B.

As shown in FIG. 15B, the host system 200 and the target systems 300A, 300B are coupled via a communication cable assembly 400HAB such that communication signals 500 can be exchanged among the host system 200 and the target systems 300A, 300B. The communication cable assembly 400HAB is shown as including a host connector assembly 420 that is coupled with a plurality of target connector assemblies 410. Being provided in the manner discussed in more detail above with reference to the communication cable assembly 400 of FIG. 2, the host connector assembly 420 is configured to couple the communication port 220 of the host system 200; whereas, the target connector assemblies 410 can couple with the communication port 310 of a selected target system 300A, 300B. Thereby, when the communication system 100 is properly assembled, communication signals 500 can be exchanged among the communication port 220 of the host system 200 and the communication ports 310 of the target systems 300A, 300B via the communication cable assembly 400HAB as discussed above. Although shown and described with reference to FIG. 15B as including two target systems 300A, 300B for purposes of illustration, the communication system 100 can include any suitable number of target systems 300.

When the communication system 100 is in an identification mode 110 as illustrated in FIG. 15B, the host system 200 is configured to provide an identification request signal 510 to one or more of the target systems 300A, 300B and to receive an identification data signal 520 from at least one of the target systems 300A, 300B in the manner set forth above. Any suitable number of identification enable signals 510 likewise can be used by the communication system 100 to identify the target systems 300A, 300B. As discussed above, the identification enable signal 510 can comprise one or more composite identification enable signals 510 and/or separate identification enable signals 510A, 510B as shown in FIG. 15B. The target systems 300A, 300B, respectively, can receive the identification request signals 510A, 5101B from the host system 200 and, in response, can provide identification data signals 520A, 520B to the host system 200. The identification data signals 520A, 520B likewise can comprise one or more composite identification data signals 520 and/or separate identification data signals 520 as discussed above.

Upon receiving the identification data signal 520, the host system 200 is configured to attempt to identify the target systems 300A, 300B in the manner discussed in more detail above based at least in part upon information regarding the target system characteristics included with the identification data signal 520. Upon identifying the target systems 300A, 300B, the host system 200 likewise can be at least partially reconfigured, as necessary, such that the host system 200 can be compatible with the target systems 300A, 300B as discussed above. The communication system 100 thereby is configured to operate as a conventional communication system in the operation mode 120 (shown in FIG. 7B), exchanging communication signals 500, such as an operation signal 530 (shown in FIG. 7B), among the host system 200 and the target systems 300A, 300B in the manner set forth above.

Figure 18:
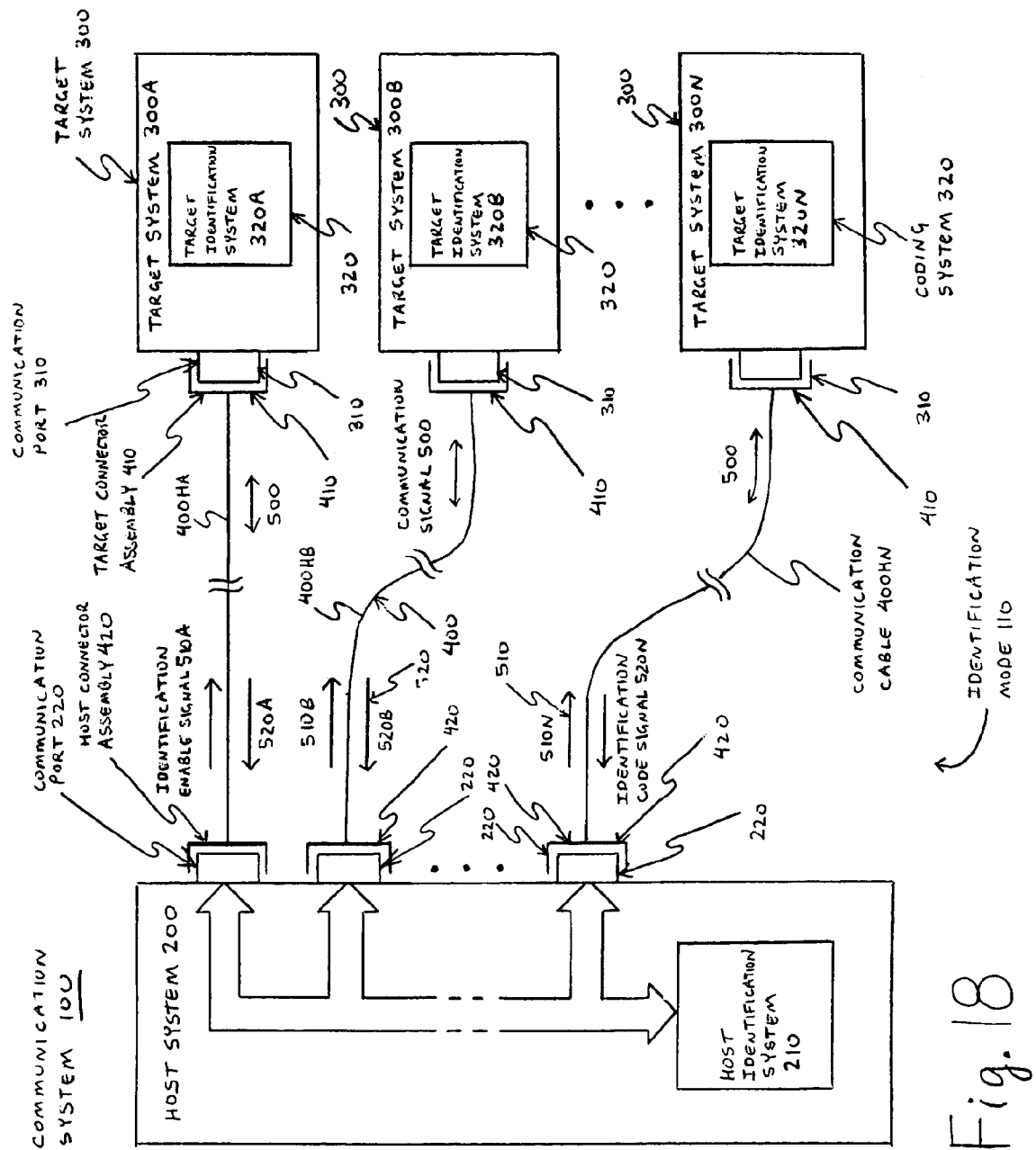
FIG. 18 is a detail drawing illustrating another alternative embodiment of the communication system of FIGS. 14A-F in which the host system includes a plurality of communication ports for coupling with the plurality of target systems.

Turning to FIG. 18, the exemplary communication system 100 comprises a host system 200 and a plurality of target systems 300A-N. The host system 200 can be provided in the manner set forth above with reference to FIG. 2 and is shown as including a suitable number of communication ports 220 for coupling the host system 200 with the target systems 300A-N. The communication ports 220, in whole and/or in part, likewise can be associated with a host identification system 210 as desired. The target systems 300A-N can be provided in the manner discussed above regarding the target system 300 shown in FIG. 2. Each target system 300A-N can have at least one communication port 310 for coupling with a relevant communication port 220 of the host system 200 and can be respectively associated with a target identification system 320A-N.

The host system 200 and the target systems 300A-N can be coupled, and configured to communicate, in any conventional manner, including directly and/or indirectly. As shown in FIG. 18, the host system 200 and the target systems 300A-N are coupled via communication cable assemblies 400HA, 400HB, ..., 400HN such that communication signals 500 can be exchanged among the host system 200 and the target systems 300A-N. Each of the communication cable assemblies 400HA, 400HB, ..., 400HN is provided in the manner discussed in more detail above with reference to the communication cable assembly 400 of FIG. 2 and is shown as including a target connector assembly 410 that is coupled with a host connector assembly 420. As discussed above, the host connector assembly 420 of each communication cable assembly 400HA, 400HB, ..., 400HN is configured to couple with a relevant communication port 220 of the host system 200; whereas, each target connector assembly 410 can couple with the communication port 310 of a selected target system 300A-N. Thereby, when the communication system 100 is properly assembled, the communication port 220 of the host system 200 can exchange the communication signals 500 with the communication ports 310 of the target systems 300A-N via the communication cable assemblies 400HA, 400HB, ..., 400HN as discussed above.

When the communication system 100 is in an identification mode 110 as illustrated in FIG. 18, the host system 200 is configured to provide an identification request signal 510 to one or more of the target systems 300A-N and to receive an identification data signal 520 from at least one of the target systems 300A-N in the manner set forth above. Any suitable number of identification enable signals 510A-N can be used by the communication system 100 to identify the target systems 300A-N. As discussed above, the identification enable signals 510A-N can comprise one or more composite identification enable signals 510 and/or separate identification enable signals 510. The target systems 300A-N, respectively, can receive the identification request signals 510A-N from the host system 200 and, in response, can provide identification data signals 520A-N to the host system 200. The identification data signals 520A-N likewise can comprise one or more composite identification data signals 520 and/or separate identification data signals 520 as discussed above.

Upon receiving the identification data signals 520A-N, the host system 200 is configured to attempt to identify the target systems 300A-N in the manner discussed in more detail above based at least in part upon information regarding the target system characteristics included with the identification data signals 520A-N. Upon identifying the target systems 300A-N, the host system 200 likewise can be at least partially reconfigured, as necessary, such that the host system 200 can be compatible with the target systems 300A-N as discussed above. The communication system 100 thereby is configured to operate as a conventional communication system in the operation mode 120 (shown in FIG. 7B), exchanging communication signals 500, such as an operation signal 530 (shown in FIG. 7B), among the host system 200 and the target systems 300A-N in the manner set forth above.

The various embodiments disclosed herein are susceptible to various modifications and alternative forms, and specific examples thereof have been shown by way of example in the drawings and are herein described in detail. It should be understood, however, that the various embodiments disclosed herein are not to be limited to the particular forms or methods disclosed, but to the contrary, the invention is to cover all modifications, equivalents, and alternatives falling within the spirit and scope of the claims.

What is claimed is:

1. An identification system for identifying a target system, comprising:
    a biasing system for providing a predetermined signal state on a selected conductor of a communication cable assembly for coupling the target system with a hardware logic emulation system; and
    a processing system for receiving said predetermined signal state via said selected conductor, wherein the processing system places the target system into an identification mode in response to said received predetermined signal state and wherein the target system while in the identification mode provides information regarding a target system characteristic including a system type of the target system to the hardware logic emulation system via the communication cable assembly, said processing system being remote from said biasing system,
    wherein, once the hardware logic emulation system has identified the target system in response at least partially to the system type of the target system characteristic, the hardware logic emulation system places the target system out of the identification mode and into an operation mode,
    wherein the target system communicates with the hardware logic emulation system in the operation mode to verify the functionality of a logic circuit design;
    wherein said biasing system provides a predetermined signal state on each of a plurality of selected conductors of the communication cable assembly; and
    wherein each of said predetermined signal states of said plurality of selected conductors provides a target system characteristic of varying levels.

2. The identification system of claim 1, wherein said biasing system comprises a passive biasing system.

3. The identification system of claim 2, wherein said biasing system includes a resistive element.

4. The identification system of claim 3, wherein said resistive element comprises a resistor.

5. The identification system of claim 3, wherein said resistive element comprises a transistor.

6. The identification system of claim 3, wherein said resistive element is provided via an input/output block of a field-programmable gate array.

7. The identification system of claim 3, wherein said resistive element is coupled with a reference source.

8. The identification system of claim 7, wherein said reference source comprises a voltage reference source.

9. The identification system of claim 7, wherein said reference source comprises a current reference source.

10. The identification system of claim 3, wherein said resistive element is grounded.

11. The identification system of claim 1, wherein the predetermined signal state of at least one of said plurality of selected conductors differs from another predetermined signal state of at least one other of said plurality of selected conductors.

12. The identification system of claim 1, wherein the predetermined signal states of said plurality of selected conductors comprise hierarchical signal states.

13. The identification system of claim 1, wherein said biasing system adjustably biases said selected conductor.

14. The identification system of claim 1, wherein said biasing system couples with the communication cable assembly.

15. The identification system of claim 14, wherein said biasing system removably couples with the communication cable assembly.

16. The identification system of claim 14, wherein said biasing system indirectly couples with the communication cable assembly via the target system.

17. The identification system of claim 1, wherein said processing system includes a database for identifying the target system.

18. The identification system of claim 1, wherein said processing system includes a look-up table for identifying the target system.

19. The identification system of claim 1, wherein said processing system couples with the communication cable assembly.

20. The identification system of claim 19, wherein said processing system removably couples with the communication cable assembly.

21. The identification system of claim 19, wherein said processing system indirectly couples with the communication cable assembly via the hardware logic emulation system.

22. The identification system of claim 1, wherein said processing system reconfigures the hardware logic emulation system to be compatible with the target system.

* * * * *